(12) United States Patent
Wada

(10) Patent No.: US 7,859,839 B2
(45) Date of Patent: Dec. 28, 2010

(54) STORAGE APPARATUS, FAN DEVICE, AND CONTROLLER UNIT DEVICE

(75) Inventor: Naoki Wada, Odawara (JP)

(73) Assignee: Hitachi, Ltd., Tokyo (JP)

( * ) Notice: Subject to any disclaimer, the term of this patent is extended or adjusted under 35 U.S.C. 154(b) by 149 days.

(21) Appl. No.: 12/232,709

(22) Filed: Sep. 23, 2008

(65) Prior Publication Data

US 2010/0033930 A1 Feb. 11, 2010

(30) Foreign Application Priority Data

Aug. 6, 2008 (JP) ............................. 2008-203002

(51) Int. Cl.
*H05K 7/20* (2006.01)
(52) U.S. Cl. ...................................... 361/695; 361/694
(58) Field of Classification Search ........................ None
See application file for complete search history.

(56) References Cited

U.S. PATENT DOCUMENTS

| | | | | |
|---|---|---|---|---|
| 5,247,427 A * | 9/1993 | Driscoll et al. | ......... | 361/679.39 |
| 5,788,467 A * | 8/1998 | Zenitani et al. | ............ | 417/360 |
| 6,927,980 B2 * | 8/2005 | Fukuda et al. | .............. | 361/700 |
| 7,558,056 B2 * | 7/2009 | Suzuki et al. | ............ | 361/679.49 |
| 2004/0008484 A1 * | 1/2004 | Konshak et al. | ............ | 361/687 |
| 2005/0117310 A1 * | 6/2005 | Miyamoto et al. | .......... | 361/724 |
| 2007/0053154 A1 * | 3/2007 | Fukuda et al. | ............ | 361/687 |
| 2007/0207720 A1 * | 9/2007 | Henry et al. | ................ | 454/184 |
| 2009/0059520 A1 * | 3/2009 | Tanaka et al. | ............... | 361/692 |
| 2009/0059522 A1 * | 3/2009 | Katakura et al. | ............ | 361/695 |

FOREIGN PATENT DOCUMENTS

| | | |
|---|---|---|
| JP | 10-062047 | 8/1996 |
| JP | 2008-047658 | 8/2006 |

* cited by examiner

*Primary Examiner*—Gregory D Thompson
(74) *Attorney, Agent, or Firm*—Stites & Harbison, PLLC; Juan Carlos A. Marquez, Esq.

(57) ABSTRACT

The invention proposes a cooling structure of a storage apparatus in which cooling air in a chassis is stirred or evened out without affecting the layout in the chassis. The storage apparatus includes fan devices that introduce outside air to heat areas generated from heat generating members arranged on a logical substrate which constitutes a controller unit section for inputting and outputting a data to and from a hard disk drive in response to a data I/O request from a host system, cool the heat areas by stirring the cooling air therein or by causing the cooling air to blow evenly thereon, and discharge the outside air passed through the heat areas to the outside.

14 Claims, 31 Drawing Sheets

FIG. 19
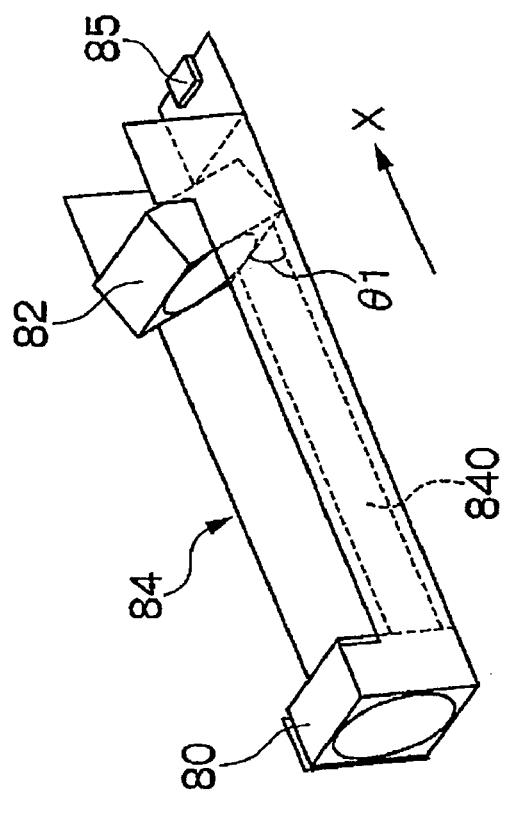
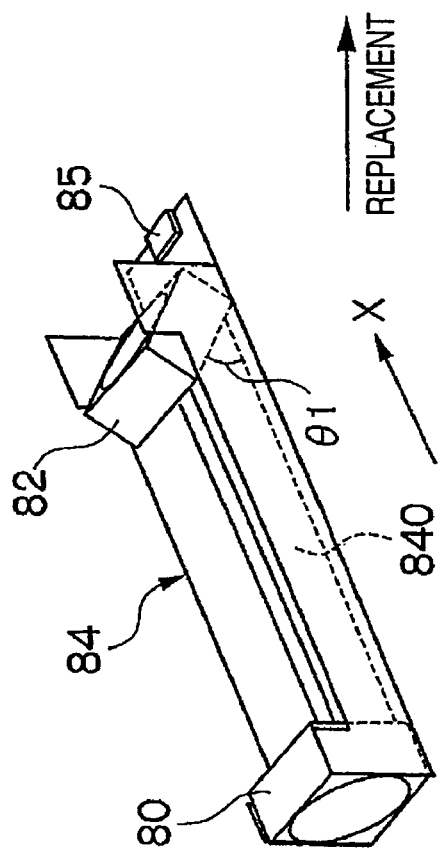

*FIG. 31*

| DATA TRANSFER SIZE (%) | MODE |
|---|---|
| 87.6–100 | NORMAL OPERATION MODE |
| 75.1–87.5 | 1/8 POWER-SAVING MODE |
| 62.6–75.0 | 2/8 POWER-SAVING MODE |
| 50.1–62.5 | 3/8 POWER-SAVING MODE |
| 37.6–50.0 | 4/8 POWER-SAVING MODE |
| 25.1–37.5 | 5/8 POWER-SAVING MODE |
| 12.6–25.0 | 6/8 POWER-SAVING MODE |
| 0.1–12.5 | 7/8 POWER-SAVING MODE |
| 0 | ALL PACKAGES POWER-SAVING MODE |

| 7110 | 7111 |
|---|---|
| 75.1–100 |  |
| 50.1–75.0 | 1/4 POWER-SAVING MODE |
| 25.1–50.0 | 2/4 POWER-SAVING MODE |
| 0.1–25.0 | 3/4 POWER-SAVING MODE |
| 0 | ALL PACKAGES POWER-SAVING MODE |

| 7110 | 7111 |
|---|---|
| DATA TRANSFER SIZE (%) | MODE |
| 0.1–100 | NORMAL OPERATION MODE |
| 0 | POWER-SAVING MODE (POWER OFF)お |

| | PACKAGE OPERATING MODE 7120 | | | | NUMBER OF REVOLUTIONS LEVEL 7121 | | | |
|---|---|---|---|---|---|---|---|---|
| | PATTERN 1 | PATTERN 2 | PATTERN 3 | PATTERN 4 | FAN A | FAN B | FAN C | FAN D |
| PATTERN 1 { | NORMAL | NORMAL | NORMAL | NORMAL | LEVEL 4 | LEVEL 4 | LEVEL 4 | LEVEL 4 |
| | POWER-SAVING MODE | NORMAL | NORMAL | NORMAL | LEVEL 3 | LEVEL 3 | LEVEL 3 | LEVEL 3 |
| PATTERN 2 { | NORMAL | POWER-SAVING MODE | NORMAL | NORMAL | LEVEL 3 | LEVEL 3 | LEVEL 3 | LEVEL 3 |
| | NORMAL | NORMAL | POWER-SAVING MODE | POWER-SAVING MODE | LEVEL 4 | LEVEL 4 | LEVEL 4 | LEVEL 4 |
| PATTERN 3 { | NORMAL | NORMAL | NORMAL | POWER-SAVING MODE | LEVEL 4 | LEVEL 4 | LEVEL 4 | LEVEL 4 |
| | NORMAL | NORMAL | POWER-SAVING MODE | NORMAL | LEVEL 2 | LEVEL 2 | STOP | LEVEL 2 |
| PATTERN 4 { | POWER-SAVING MODE | POWER-SAVING MODE | NORMAL | NORMAL | LEVEL 2 | STOP | LEVEL 2 | LEVEL 2 |
| | POWER-SAVING MODE | NORMAL | POWER-SAVING MODE | NORMAL | LEVEL 2 | LEVEL 2 | LEVEL 2 | LEVEL 2 |
| PATTERN 5 { | NORMAL | NORMAL | POWER-SAVING MODE | NORMAL | LEVEL 2 | LEVEL 2 | LEVEL 2 | LEVEL 2 |
| | POWER-SAVING MODE | NORMAL | NORMAL | POWER-SAVING MODE | LEVEL 2 | LEVEL 2 | LEVEL 2 | LEVEL 2 |
| PATTERN 6 { | POWER-SAVING MODE | NORMAL | NORMAL | NORMAL | LEVEL 2 | LEVEL 2 | LEVEL 2 | LEVEL 2 |
| | POWER-SAVING MODE | POWER-SAVING MODE | POWER-SAVING MODE | POWER-SAVING MODE | LEVEL 1 | STOP | STOP | LEVEL 1 |

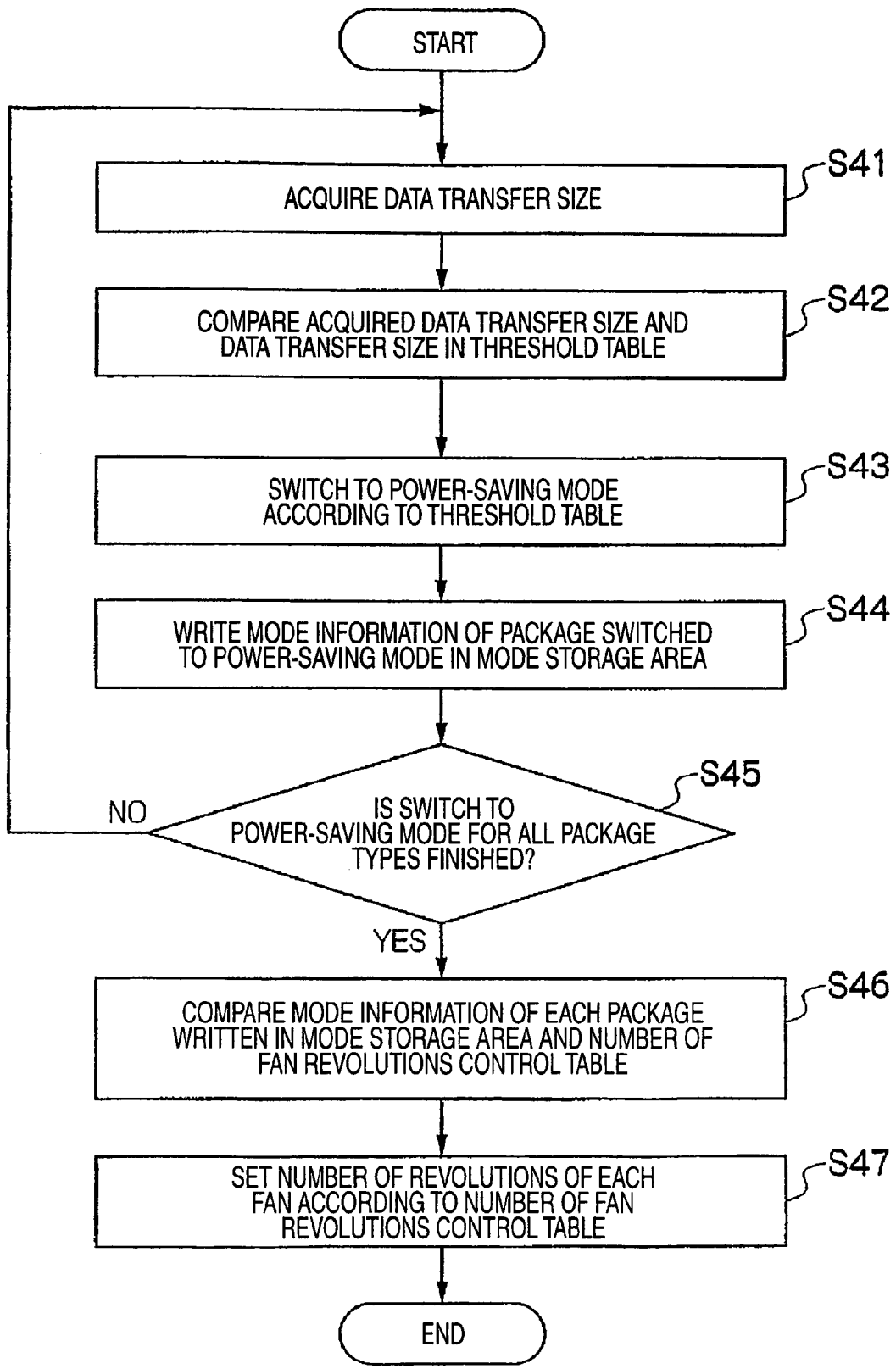

STORAGE APPARATUS, FAN DEVICE, AND CONTROLLER UNIT DEVICE

CROSS REFERENCES TO RELATED APPLICATIONS

This application relates to and claims priority from Japanese Patent Application No. 2008-203002, filed on Aug. 6, 2008, the entire disclosure of which is incorporated herein by reference.

BACKGROUND OF THE INVENTION

1. Field of the Invention

The present invention relates to a cooling structure of a storage apparatus stored in a chassis.

2. Description of the Related Art

Generally, in an electronic apparatus, part of electric power supplied to hard disk drives is converted into a friction heat generated by the rotation of the hard disk drives or a resistance heat of an electronic circuit. The heating value of the storage apparatus having such a hard disk drive mounted thereon increases with increase in mounting density of the hard disk drives to be mounted. When the heating value increases, the probability of trouble in the storage apparatus 1 is increased. Therefore, it is necessary to cool the hard disk drives and a logical substrate which generate heat while the storage apparatus is in operation.

Therefore, fans are mounted to the front and back of a chassis for storing the storage apparatus to cool the hard disk drive and the logical substrate. The both fans mounted on the chassis generate a flow channel of a cooling air by taking outside air into the interior of the storage apparatus to cool the same by one of the fans, and discharging heat in the storage apparatus to the outside air by the other fan.

However, specifically, the locations to arrange heat generating members which constitute the logical substrate vary depending on the role in the storage apparatus. In addition, in recent years, the hard disk drives and the logical substrate is mounted in the high density, improved performance of the fans is achieved. In association with such circumstances, the flow rate of the fan is further increased, which results in formation of a single flow channel. Therefore, the cooling air flows disproportionally, so that the heat generating members mounted on locations apart from the flow channel are not cooled sufficiently.

Accordingly, JP-A-2008-47658 discloses a technology to control the flow of cooling air by guiding the cooling air reflected from the circuit board to the heat generating members using the circuit board adjusted in angle as an air stream control panel.

Japanese Patent No. 3944888 discloses a technology in a structure in which a circuit board is removably inserted into a motherboard arranged vertically to a chassis for storing a circuit board, such that a vent hole is formed in the motherboard to resolve air accumulation generated by air hitting on the motherboard.

The technology disclosed in the JP-A-2008-47658 is effective when causing the cooling air to flow a specific one area, but is not effective when there are a plurality of such specific areas. It also has a problem such that pressure loss of the fans for sending the outside air increases because the circuit board which is used as the air stream control panel is provided in the vicinity of the fan, and hence the performance of the fans is deteriorated.

The technology in Japanese Patent No. 3944888 has a problem such that the vent hole provided in the motherboard hinders wiring on the motherboard and, in addition, a connector for connecting the circuit board cannot be mounted on the motherboard.

SUMMARY OF THE INVENTION

Accordingly, it is an object of the present invention to provide a cooling structure of a storage apparatus in which cooling air in a chassis is stirred or evenly dispersed without affecting the layout in the chassis.

In order to achieve the object described above, a storage apparatus according to the invention includes: a disk box unit that stores a plurality of hard disk drives; a controller unit section that inputs and outputs data to and from the hard disk drives in response to a data input and output (I/O) request from a host system; a power supply unit that supplies power source to the disk box unit and the controller unit section; a chassis that stores the disk box unit, the controller unit section, and the power supply unit; and a fan device that introduces outside air to heat areas generated from heat generating members arranged on a logical substrate which constitutes the controller unit section, cools the heat areas by stirring the cooling air therein or by causing the cooling air to blow evenly thereon, and discharges the outside air passed through the heat areas to the outside.

In this configuration, by mounting the fan device to a location which causes the cooling air to be stirred in the heat areas or to blow evenly thereon, the cooling air blows evenly on all the heat areas, so that all over the logical substrate is cooled, and the outside air passed through the logical substrate is discharged to the outside.

The fan device according to the invention is mounted so as to introduce outside air to heat areas generated by heat generating members arranged on a logical substrate which constitutes a controller unit section that inputs and outputs data to and from the hard disk drives in response to a data I/O request from a host system, cools the heat areas by stirring the cooling air therein or by causing the cooling air to blow evenly thereon, and discharge the outside air passed through the heat areas to the outside.

In this configuration, the cooling air blows evenly on all the heat areas, and hence all over the logical substrate is cooled, and the outside air passed through the logical substrate is discharged to the outside.

A controller unit device according to the invention is a controller unit device that inputs and outputs data to and from the hard disk drives in response to a data input and output request from a host system, including: a fan unit that introduces outside air to heat areas generated by heat generating members arranged on a logical substrate which constitutes the controller unit device, cools the heat areas by stirring the cooling air therein or by causing the cooling air to blow evenly thereon, and discharge the outside air passed through the heat areas to the outside.

In this configuration, the cooling air blows on all the heat areas, so that all over the logical substrate is cooled and the outside air passed through the logical substrate is discharged to the outside.

According to the invention, with the additional provision of the fan taking the arrangement of the heat generating members into consideration, the cooling air flowing in the chassis is stirred or flowed evenly without affecting the layout in the chassis.

BRIEF DESCRIPTION OF THE DRAWINGS

FIG. 19 is an explanatory drawing showing a state of replacement of a fan unit according to the first embodiment;

FIG. 31 is a chart of a threshold table retained by the FE package;

FIG. 32 is a chart of a threshold table retained by the BE package;

FIG. 33 is a chart of a threshold table retained by the CM package and the SW package;

FIG. 34 is a chart of a number of revolutions control table retained by the package group 3;

FIG. 36 is a flowchart showing a process to switch to a power-saving mode and a number of revolutions controlling process.

DESCRIPTION OF THE PREFERRED EMBODIMENTS

Figure 1:
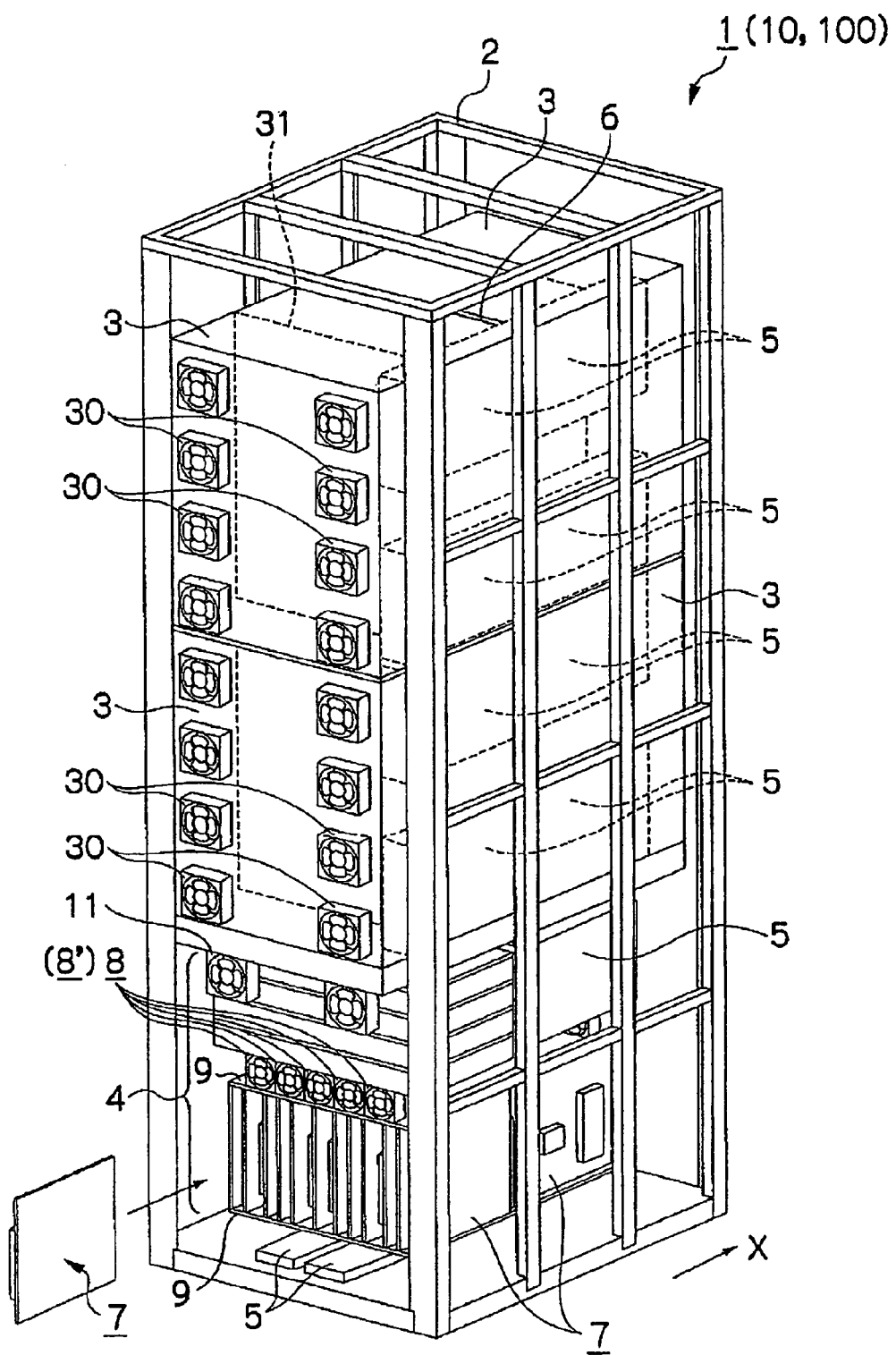
FIG. 1 is a perspective view showing a configuration of a storage apparatus.

Referring now to the drawings, embodiments of the invention will be described.

(1) First Embodiment (1-1) Hardware Configuration of Storage Apparatus

Figure 2:
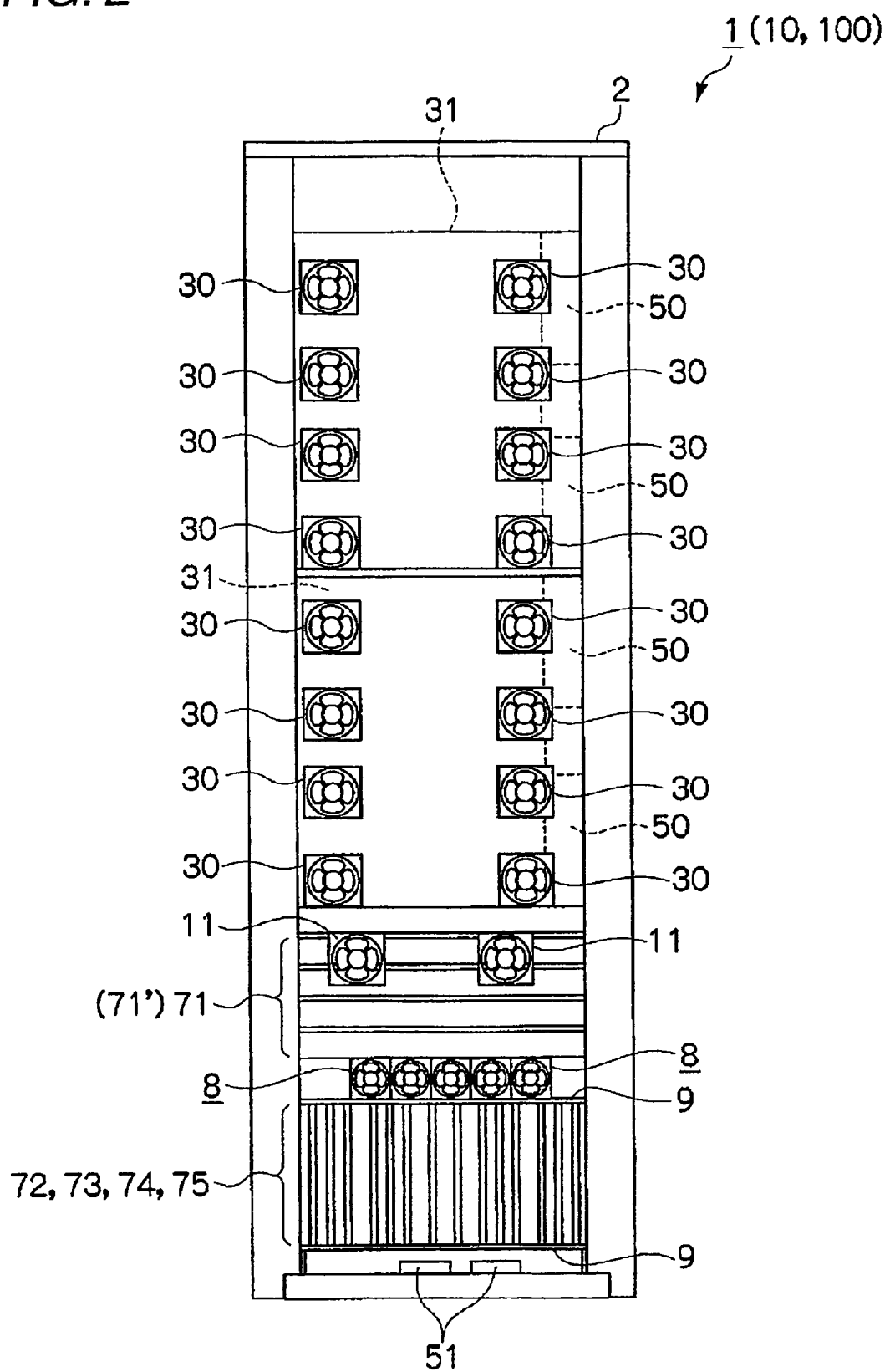
FIG. 2 is a front view showing a configuration of the storage apparatus.

FIG. 1 is a general perspective view of a storage apparatus 1, and FIG. 2 is a front view showing a front of the storage apparatus 1. As shown in FIG. 1 and FIG. 2, HDD box units 3 and a controller unit section 4 are stored in a large rectangular shape chassis 2 in this order from the upper side (top side) to the bottom side (grounded side) of the chassis 2, and power supply units 5 are stored mainly on the back side of the chassis 2 and in the interior of the HDD box units 3.

A host system 20 is connected to the storage apparatus 1, and data accessed by the host system 20 is saved in hard disk drives 31 which constitute the HDD box unit 3. The HDD box units 3 are mounted on the front side and the back side of the chassis 2 with the intermediary of a backboard. The HDD box units 3 each include a plurality of hard disk drives 31 in an array pattern.

Cooling fans 30 are provided on the front side and the back side of the chassis 2 for cooling the HDD box units 3. The cooling fans 30 on the front side of the chassis 2 take outside air into the chassis 2, and the cooling fans 30 on the back side of the chassis 2 discharge the air in the chassis 2 to the outside.

The controller unit section 4 includes a plurality of logical substrates 7 which control data input and output between the host system and the storage apparatus 1. The logical substrates 7 are stored in the backboard 6 so as to allow insertion and removal thereof. The type of the logical substrates 7 includes a front end package (hereinafter, referred to simply as FE package) 72 which performs data I/O transmission with the storage apparatus 1, a back end package (hereinafter, referred to simply as BE package) 73 which controls input and output of the data to be stored in the hard disk drives, a cache memory package (hereinafter, referred to simply as CM package) 74 which stores the data from the host system temporarily, a microprocessor package (hereinafter, referred to simply as MP package) 71 which controls data transmitted between the host system and the hard disk drives, and a switch package (hereinafter, referred to simply as SW package) 75 which relays the data among these packages.

Fans 11 for cooling the MP package 71 are provided on the front side and the back side of the chassis 2.

Cooling fans 80 for taking the outside air into the chassis 2 are arranged on the upper surface of the controller unit section 4, which is located on the front side of the chassis 2. Cooling fans 81 for discharging heat air from the inside to the outside of the chassis 2 are arranged on the upper end surface of the controller unit section 4, which is located on the back side of the chassis 2, so as to be paired with the cooling fans 80. The cooling fans 80 and 81 are parts of a fan unit device 8. The fan device 8 will be described later.

Provided between the cooling fans 80 and 81 and the logical substrates 7 are thin plates 9. The each thin plate 9 is formed with vent holes 90 for allowing the cooling air from the cooling fans 80 and 81 to the logical substrates 7. The thin plates 9 are also interposed between the logical substrates 7 and batteries 51 described later.

The power supply units 5 each include an AC-DC power supply 50 and the battery 51. An AC voltage obtained from the AC-DC power supply 50 is converted into the DC voltage and the DC voltage is supplied to the controller unit section 4 and the HDD box units 3. The batteries 51 are standby power sources. The power supply units 5 are arranged in the controller unit section 4 and the HDD box units 3.

Figure 3:
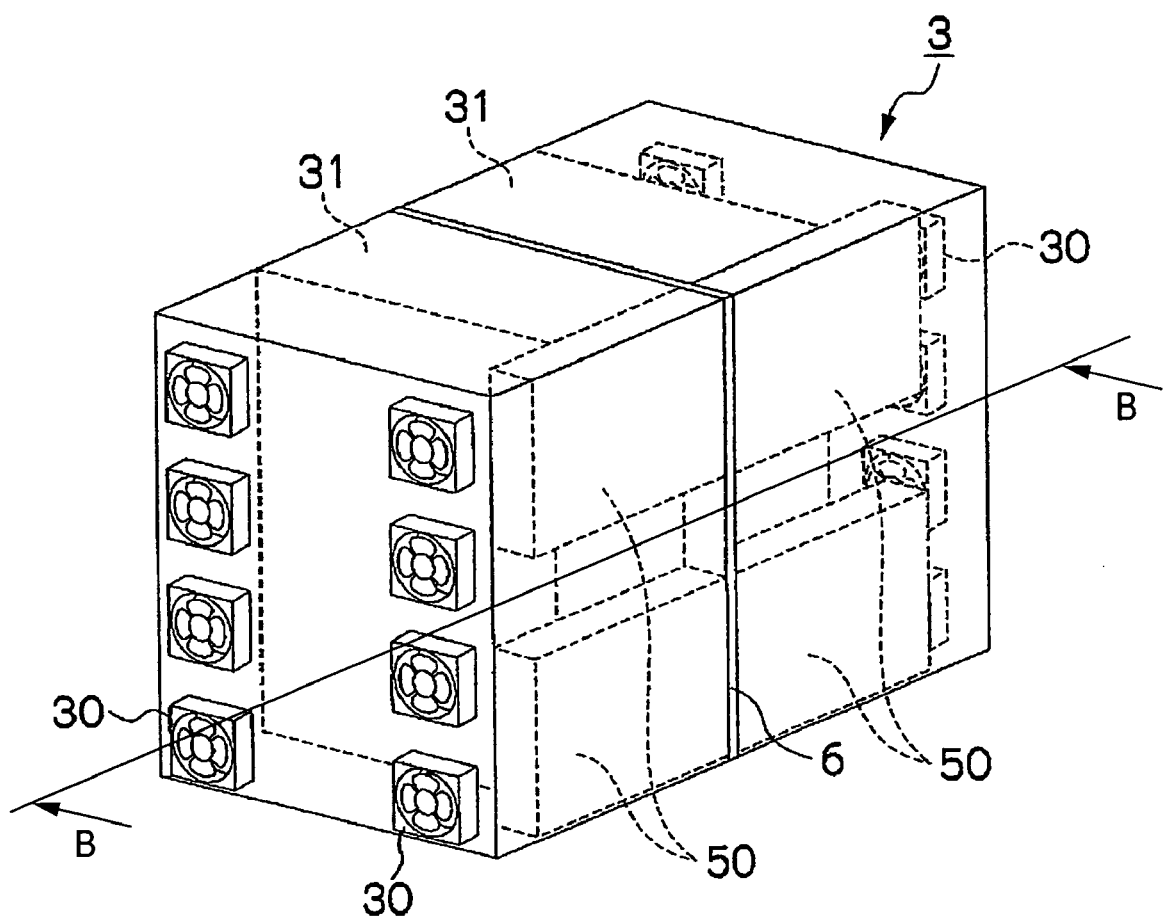
FIG. 3 is a perspective view showing a configuration of a HDD box unit.
Figure 4:
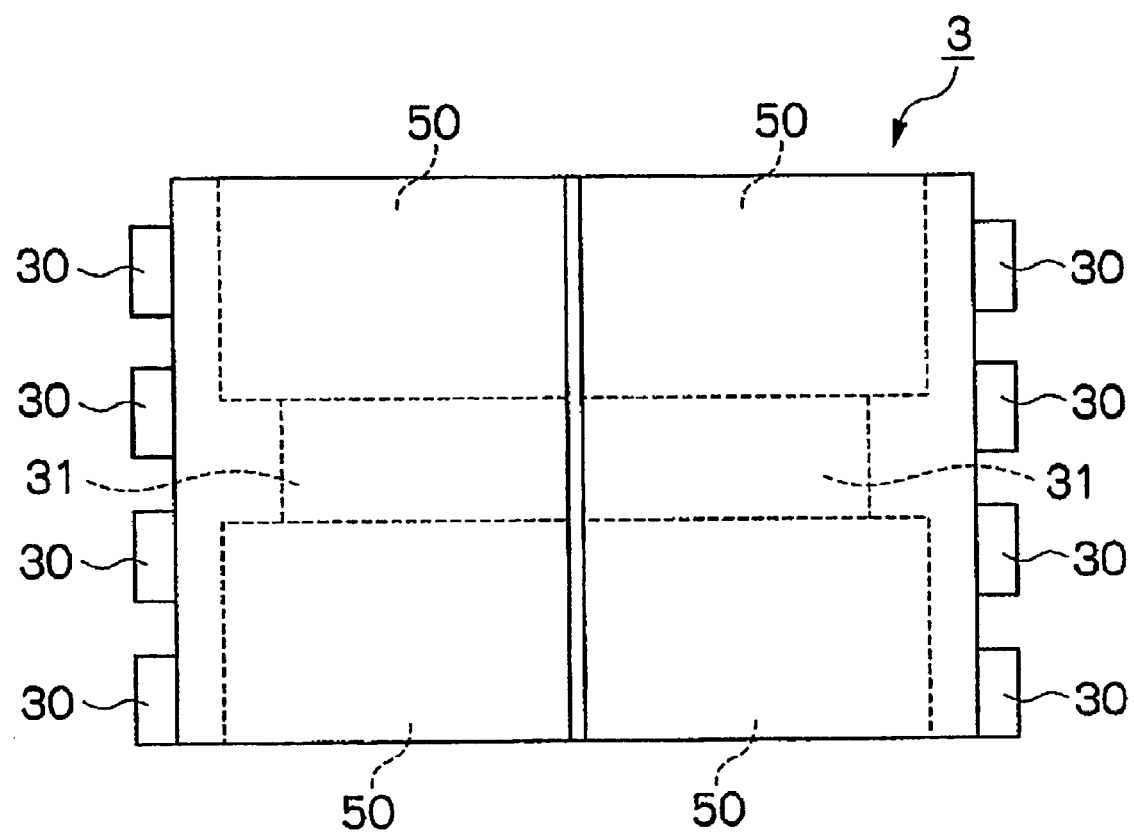
FIG. 4 is a side view of the HDD box unit shown in FIG. 3 viewed from B-B side.

FIG. 3 is a perspective view of the HDD box unit 3, and FIG. 4 is a side view corresponding to the perspective view in FIG. 3. The AC-DC power supplies 50 for supplying the DC voltage to the plurality of hard disk drives 31 are arranged in the interior of the HDD box unit 3.

Figure 5:
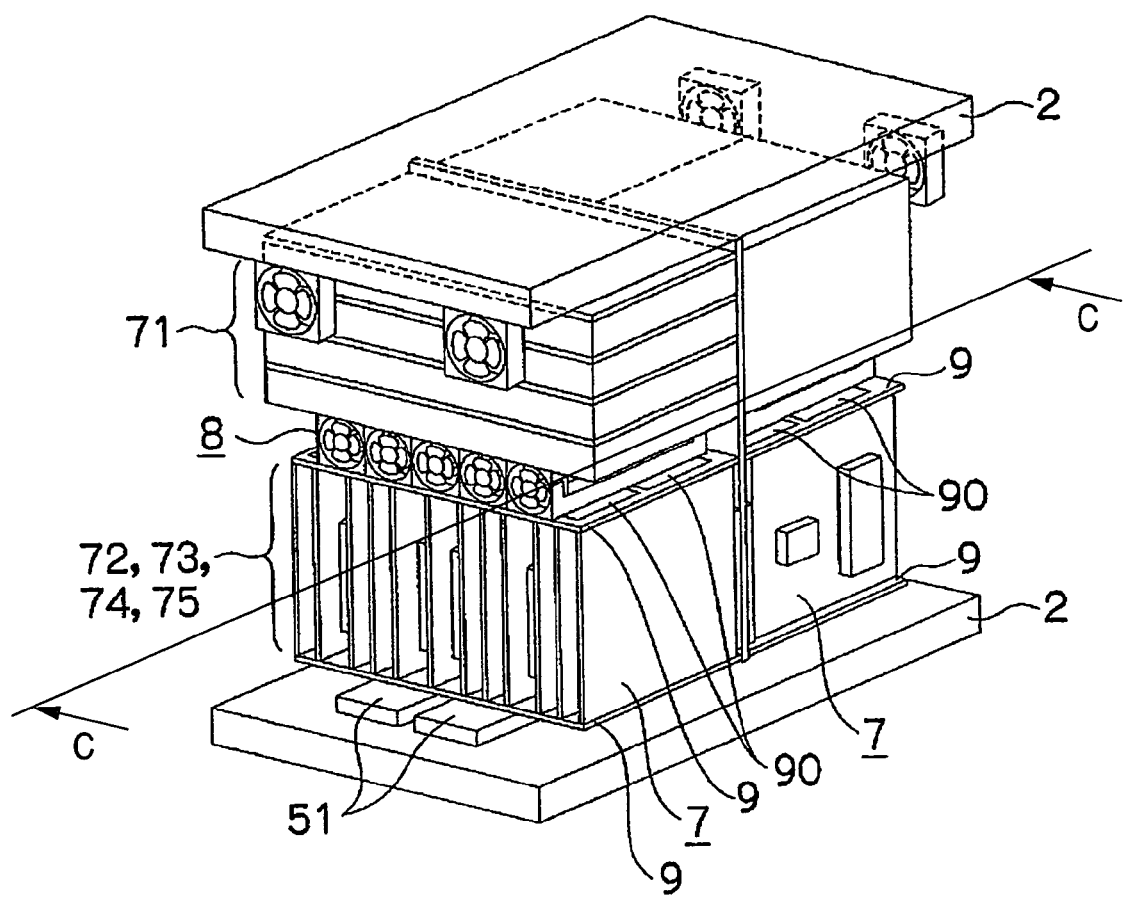
FIG. 5 is a perspective view showing a configuration of a controller unit section.
Figure 6:
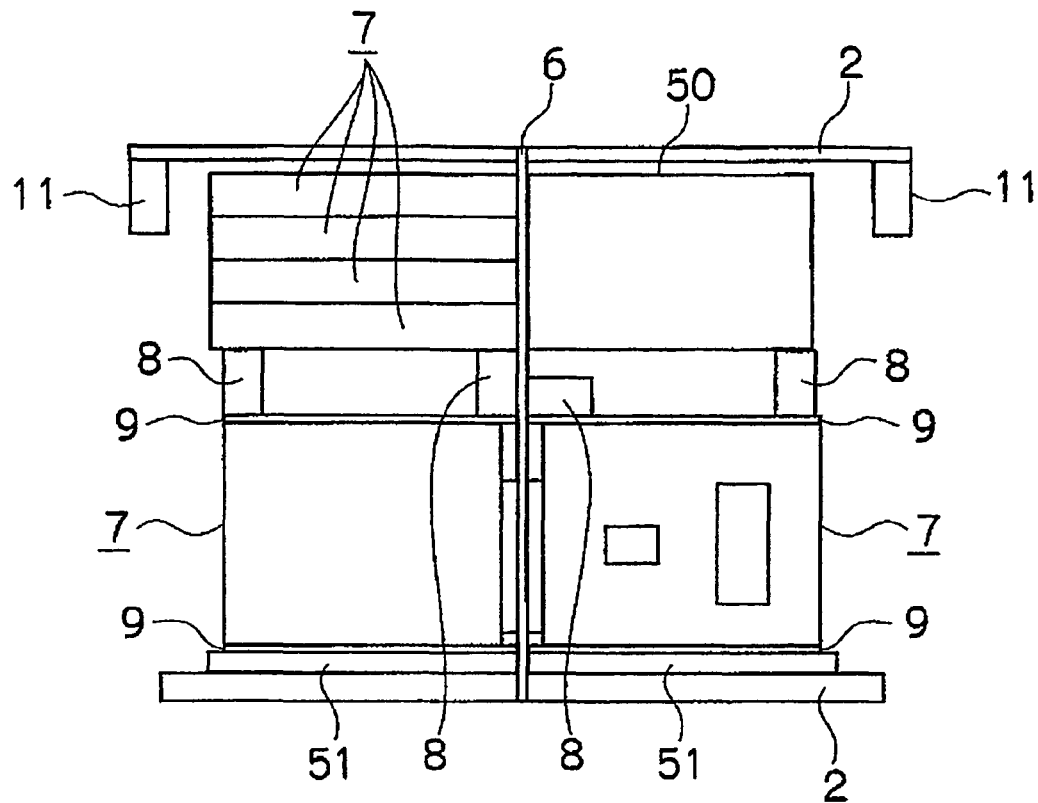
FIG. 6 is a side view of the controller unit section shown in FIG. 5 viewed from the C-C side.

FIG. 5 is a perspective view of the controller unit section 4 and FIG. 6 is a side view of the controller unit section 4. The AC-DC power supply, a SVP, the cooling fans, the logical substrates 7, and the batteries are provided from the top on the front side of the chassis 2 in this order. The AC-DC power supply supplies the DC voltage to the controller unit section 4. The MP package 41, the cooling fans, the logical substrates 7, and the batteries are provided from the top on the back side of the chassis 2 in this order. The respective components are connected to the backboard 6 via connectors.

When describing all the packages, they are generically designated as the logical substrates 7 except for the case of describing the respective packages 41 to 45 independently.

(1-2) Logical Substrate

Figure 7:
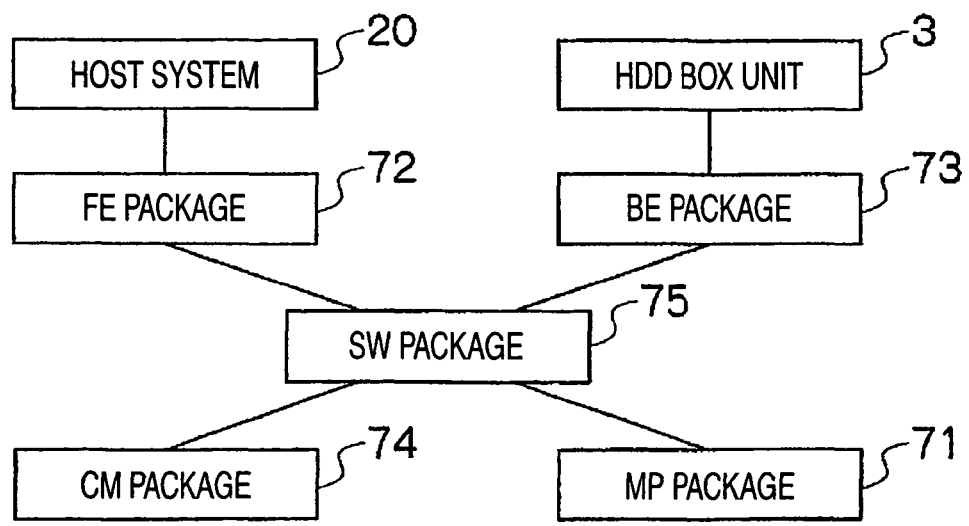
FIG. 7 is a data connection chart of the storage apparatus.

FIG. 7 is a block diagram showing a data connection of the respective packages which constitute the logical substrates 7.

The data connection of the storage apparatus 1 is such that the FE package 72 is connected to the host system, the FE package 72, the BE package 73, the CM package 74, and the MP package 71 are connected with each other via the SW package 75, and the BE package 73 is connected to the hard disk drive 31. The logical substrates 7 which constitute the respective packages are connected via the backboard 6.

Figure 8:
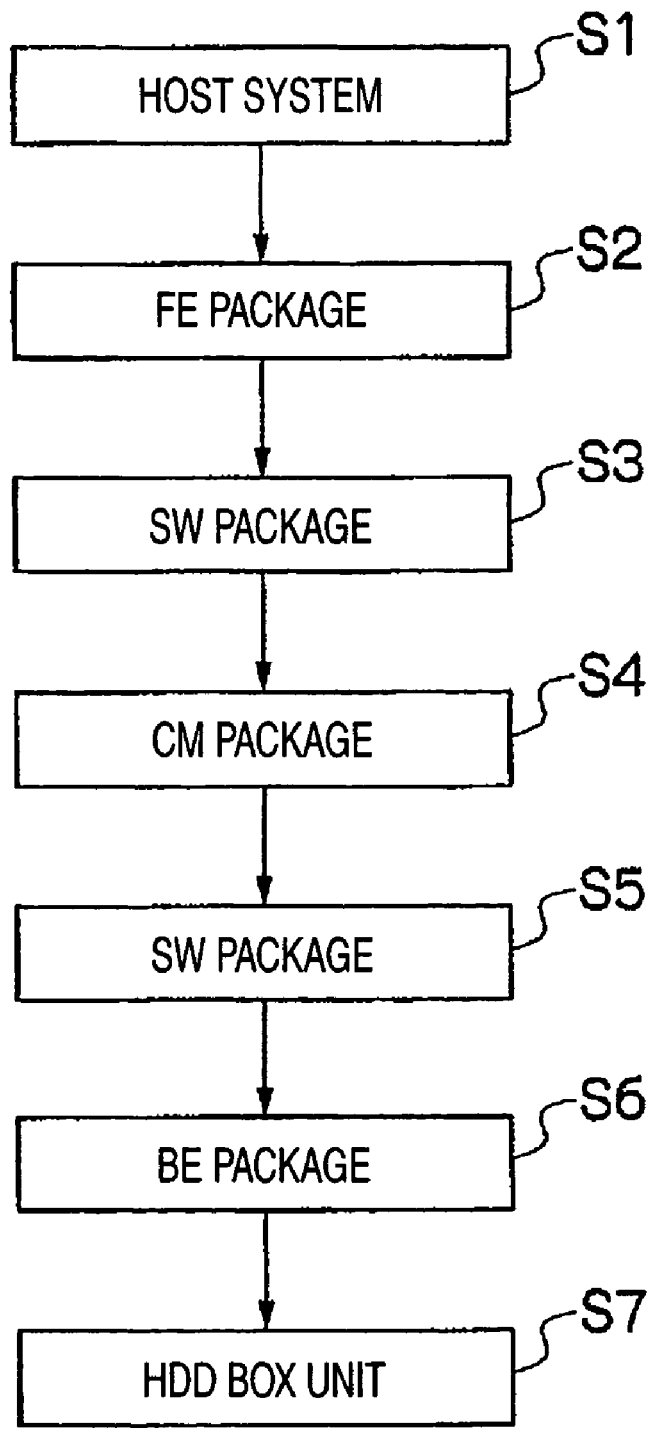
FIG. 8 is a flowchart of a writing process.

When a writing request is issued from the host system, the respective packages write data in the procedure shown in FIG. 8.

When a data write request is issued from the host system 20 (S1), the FE package 72 which performs data I/O transmission with the storage apparatus 1 receives the write request (S2). Then, the data which the FE package 72 received from the host system 20 is sent to the CM package 74 via the SW package 75 (S3, S4). The CM package 74, upon reception of the data, stores the data temporarily. Then, the CM package 74 sends the data to the BE package 73 via the SW package 75 (S5, S6). The BE package 73 sends the data to a given hard disk drive 31 and stores the data in the given hard disk drive 31 (S7).

Figure 9:
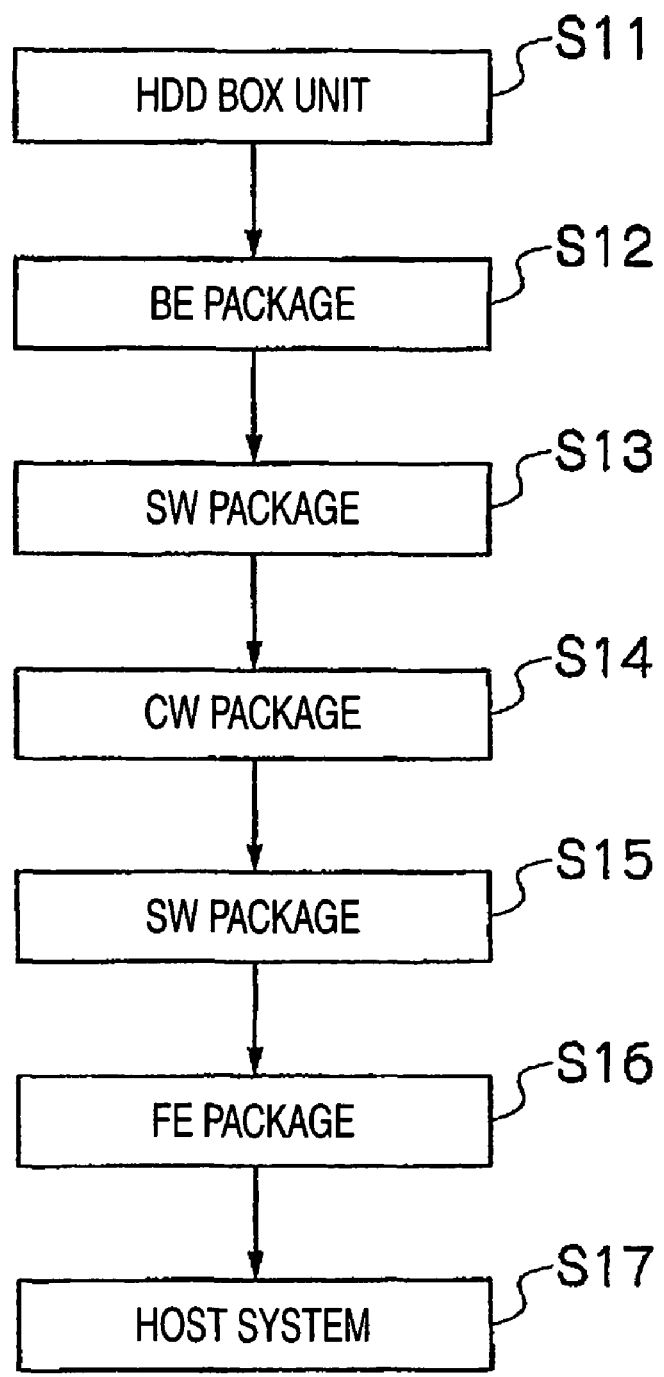
FIG. 9 is a flowchart of a reading process.

When a data read request is issued from the host system 20, the respective packages read the data in the procedure shown in FIG. 9.

When a data read request is issued from the host system 20 (S11), the BE package 73 reads data from a given hard disk drive 31 in which the data to be read is stored (S12). Then, the BE package 73 sends the read data to the CM package 74 via the SW package 75 (S13, S14). Then, the CM package 74, upon reception of the data, stores the data temporality. Then, the CM package 74 sends the data to the FE package 72 via the SW package 75 (S15, S16). The FE package 72 sends the data to the host system 20 (S17).

Figure 10:
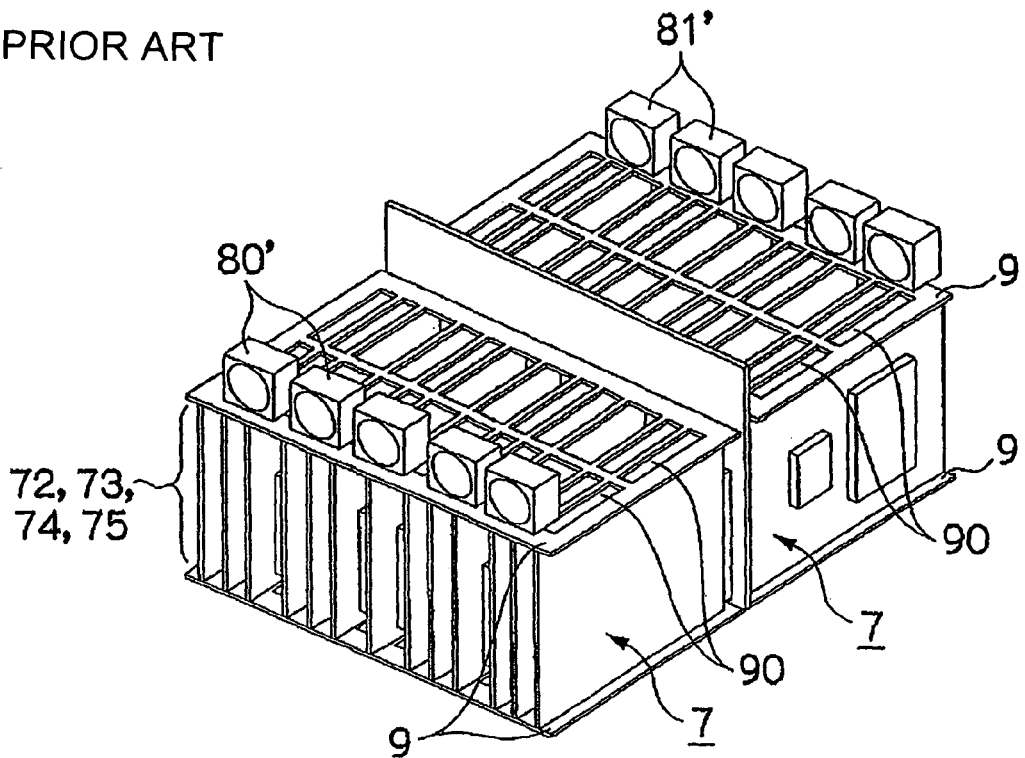
FIG. 10 is a perspective view showing a configuration of a controller unit in the related art.
Figure 11:
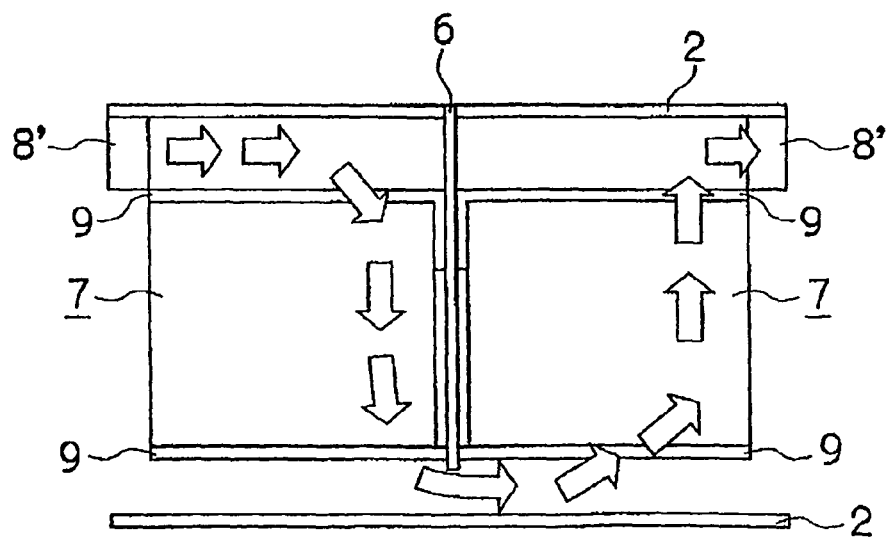
FIG. 11 is an explanatory drawing showing a flow channel for cooling air in the controller unit section in the related art.

FIG. 10 is a perspective view showing a structure of the fans in the related art. The logical substrates 7 are connected to the backboard 6, which is arranged vertically with respect to the grounded surface of the chassis 2, by inserting the same thereto from both the front side and the back side of the chassis 2. As shown in FIG. 10, the fans for cooling the logical substrates 7 are mounted in pairs of cooling fans 80' and 81' at locations which secure redundancy and prevent hindrance of inserting and removing operation of the logical substrates 7. When the cooling fans 80' and 81' are used in a rack-mount type, a gap is provided on the lower side of the backboard 6 in the height direction for cooling the lower side of the logical substrates 7. However, the gap is small, and an air flow channel as shown in FIG. 11 is formed by a flow velocity of the pairs of fans mounted for cooling the logical substrates 7.

(1-3) Layout of Logical Substrates

The respective packages have different roles in the storage apparatus 1. Therefore, the layout on the substrate of the heat generating members which constitute the respective packages is also different. The layouts for the respective packages are shown in FIG. 12 to FIG. 15, and the layout will be described for the respective packages. The layout drawing is a side view of the front of the chassis 2.

(1-3-1) Layout of the FE Package 72

Figure 12:
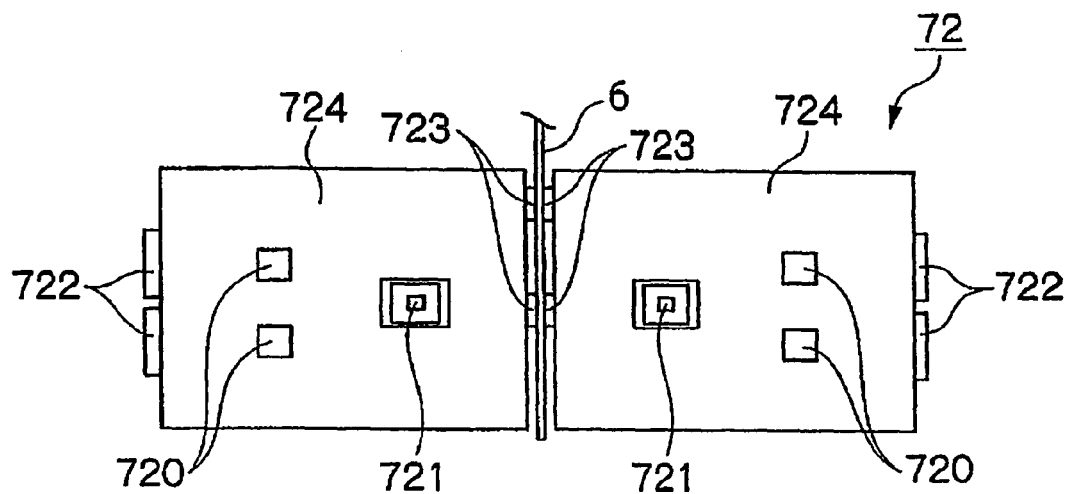
FIG. 12 is an explanatory drawing showing a FE package.

FIG. 12 shows a layout of the FE package 72. The two FE packages 72 are connected to the backboard 6 via connectors 723 of the backboard 6. The heat generating members to be mounted to each of the FE packages 72 include heat generating members 720 arranged on each substrate 724 at locations relatively apart from the backboard 6 for the connection with the host system 20 via connectors 722, and a heat generating member 721 arranged on the substrate 724 at locations relatively in the vicinity of the backboard 6 for the communication with LSIs of other packages via the backboard 6.

(1-3-2) Layout of BE Package 73

Figure 13:
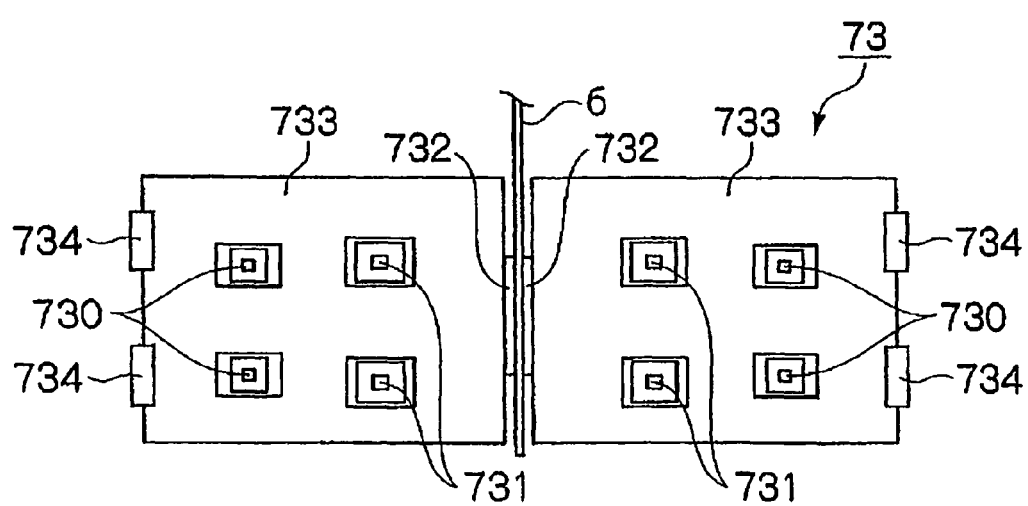
FIG. 13 is an explanatory drawing showing a BE package.

FIG. 13 shows a layout of the BE package 73. The two BE packages 73 are connected to the backboard 6 via connecters 732 of the backboard 6. The BE packages 73 have connectors 734 for the communication with the outside. The heat generating members to be mounted on each of the BE packages 73 include heat generating members 730 arranged on each substrate 733 at locations relatively apart from the backboard 6 for the connection with the hard disk drive 31, and heat generating members 731 arranged on the substrates 733 at locations relatively in the vicinity of the backboard 6 for the communication with the LSIs of other packages.

(1-3-3) Layout of CM Package 74

Figure 14:
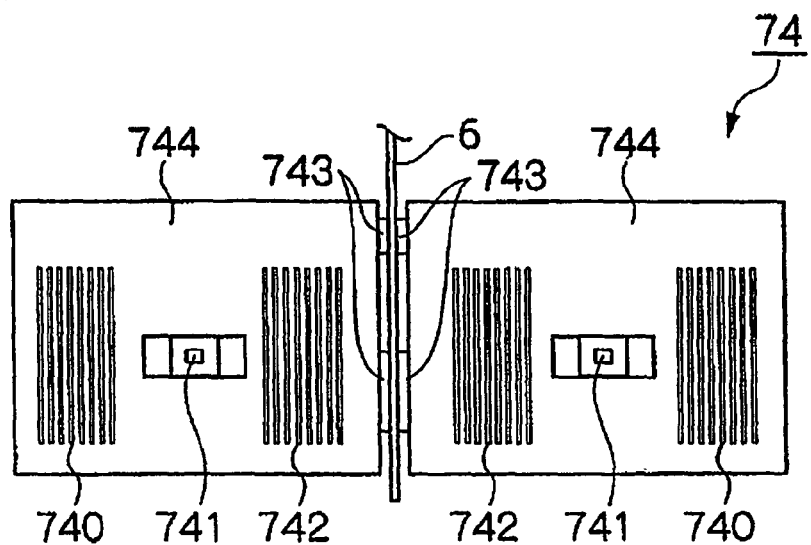
FIG. 14 is an explanatory drawing showing a CM package.

FIG. 14 shows a layout of the CM package 74. The two CM packages 74 are connected to the backboard 6 via connectors 743 of the backboard 6. The heat generating members mounted to each of the CM packages 74 include a heat generating member 741 arranged substantially at the center of a substrate 744 for the communication with the LSIs of other packages via the backboard 6 and heat generating members 742 arranged substantially equidistantly on the each substrate 744 with the intermediary of the heat generating member 741 for the communication with the heat generating member 741.

(1-3-4) Layout of SW Package 75

Figure 15:
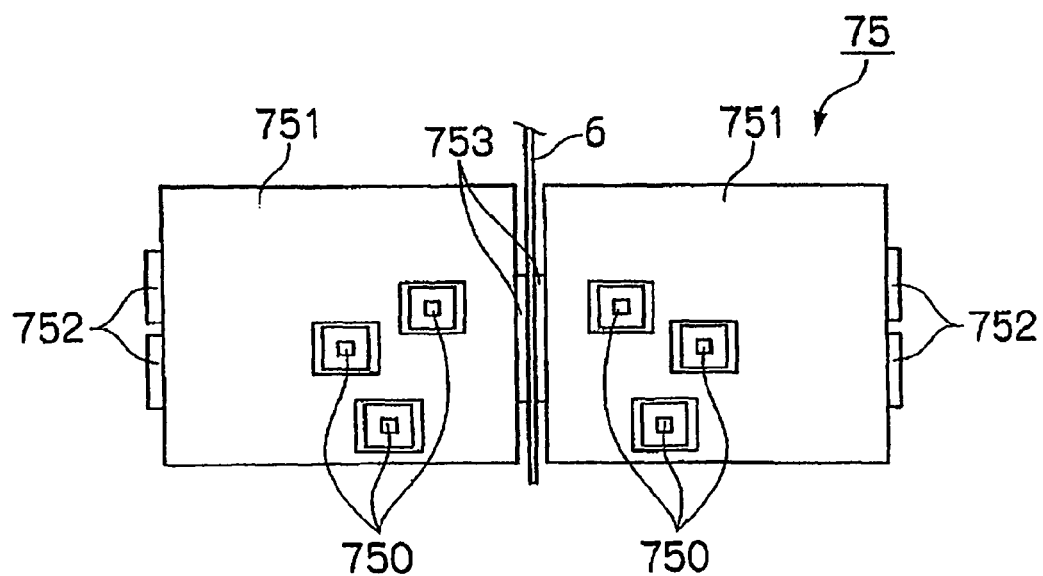
FIG. 15 is an explanatory drawing showing a SW package.

FIG. 15 shows a layout of the SW package 75. The two SW packages 75 are connected to the backboard 6 via connectors 753 of the backboard 6. A plurality of heat generating members 750 to be mounted on the each of the SW package 75 are arranged at locations in the vicinity of the backboard 6 on each substrate 751 for the communication with the LSIs of other packages via the backboard 6. The SW package 75 is also provided with connectors 752 for the communication with the outside.

Figure 16:
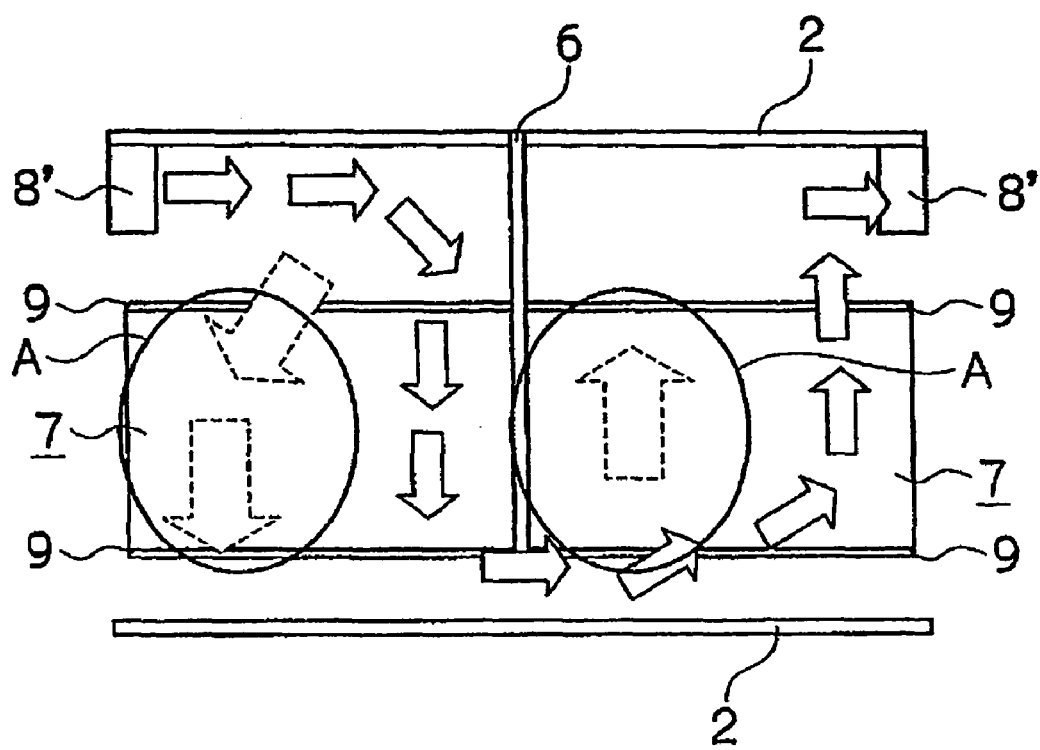
FIG. 16 is an explanatory drawing showing a problem in the flow channel for cooling air in the controller unit section in the related art.

In this manner, the arrangement of the heat generating members to be mounted on the substrate is different depending on the types of the packages, so that the heat areas generated from the heat generating members are also different. Nevertheless that the areas to be cooled differ from package to package, the flow rate of the cooling fans increases in association with the improvement of the performance of the cooling fans or the high-density structure of the storage apparatus 1. Therefore, there arise areas A which cannot get the cooling air on the logical substrate 7 as shown in FIG. 16.

(1-4) Location to Mount the Cooling Fans

Figure 17:
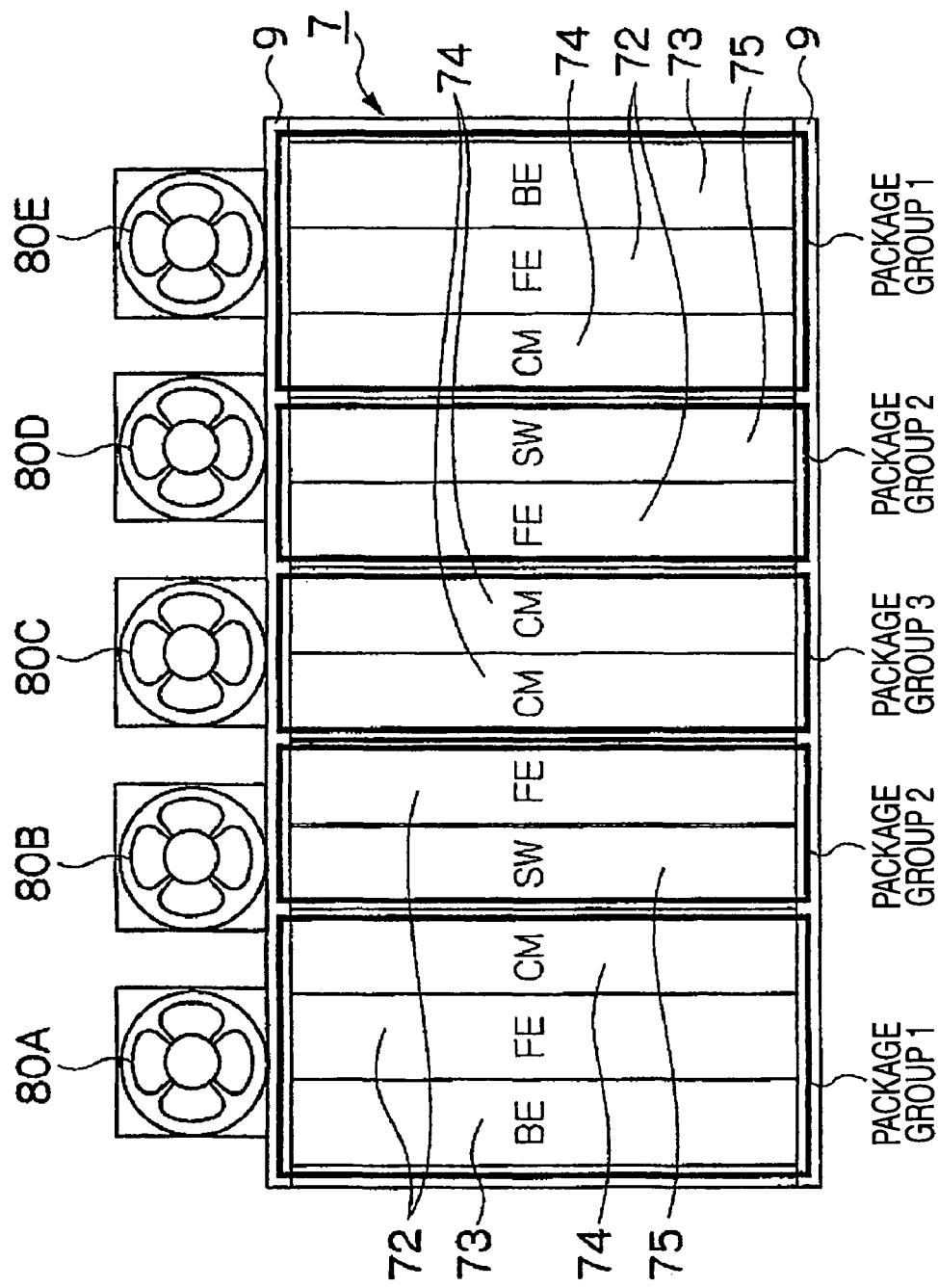
FIG. 17 is an explanatory drawing showing grouped packages which constitute the logical substrates.

FIG. 17 shows a configuration of the respective packages to be arranged on the front side of the chassis 2. The controller unit section 4 has an array of the packages shown in FIG. 17 also on the back side of the chassis 2. Therefore, in this embodiment, the numbers of respective packages arranged on the front side and the back side of the chassis 2 are; eight FE packages 72, four BE packages 73, four SW packages 75, and four CM packages 74. As described above, the plurality of cooling fans are arranged above the respective packages in order to cool all over these packages.

A package group 1 cooled by a cooling fan 80A and a cooling fan 80E includes the BE package 73, the FE package 72, and the CM package 74. This package group includes the heat generating members mounted on the substrates over the substantially entire areas thereof, and hence is a group which needs to get the cooling air over the substantially entire areas of the substrates.

A package group 2 cooled by a cooing fan 80B and a cooling fan 80D includes the SW package 75 and the FE package 72. This package group is a group including the heat generating members mounted on the backboard 6 side and hence needs to get the cooling air on the backboard 6 side.

A package group 3 cooled by a cooling fan 80C includes the CM packages 74. This package group also includes the heat generating members on the substrates over the substantially entire areas thereof as the package group 1, and hence is a group which needs to get the cooling air over the substantially entire areas of the substrates.

In this manner, the areas which need to get the cooling air are different depending on the package group. Only with the cooling fans 80 and 81, it is difficult to cause the cooling air to blow substantially on the entire areas on the substrates. Therefore, additional fans 82 and 83 are provided to cause the cooling air to blow on the corresponding areas.

Figure 18:
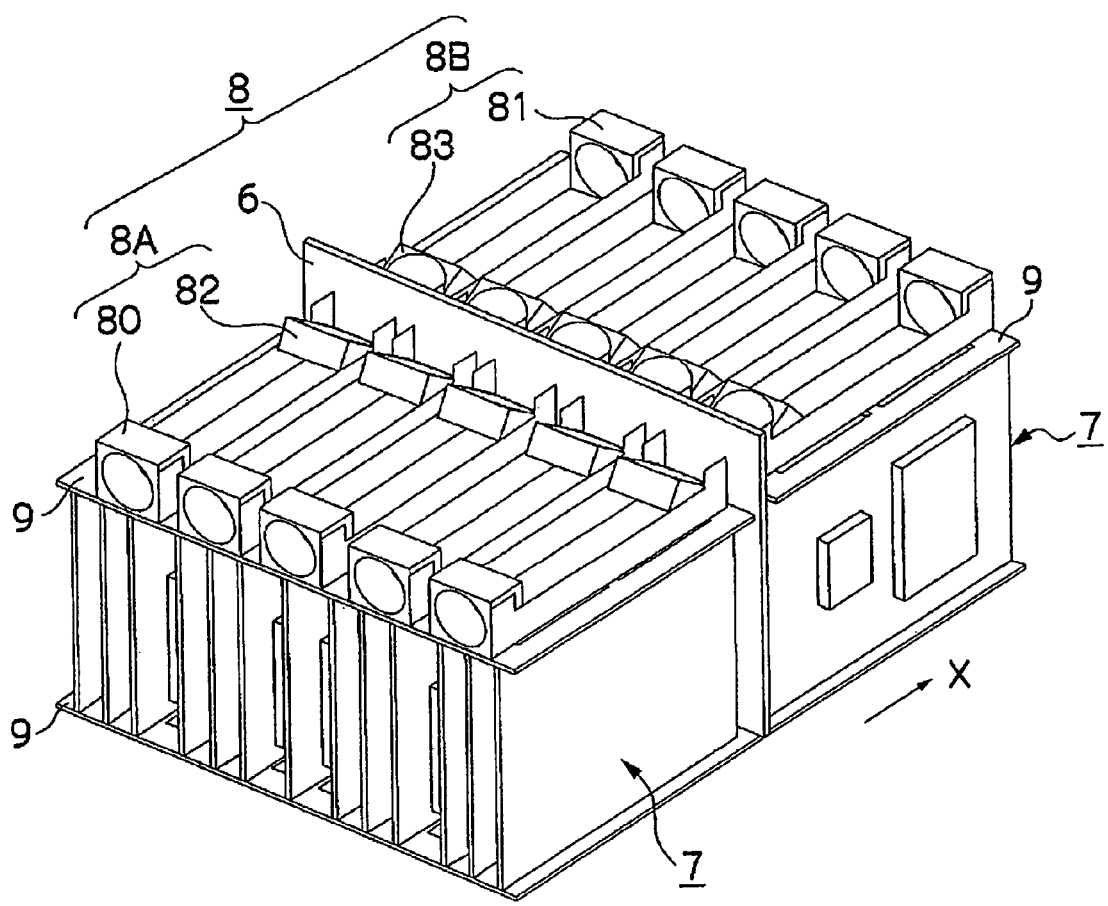
FIG. 18 is a perspective view showing a configuration of the controller unit section in the first embodiment.

In the first embodiment, as shown in FIG. 18, the additional fans 82 and 83 are installed within the chassis 2 as the fan device 8 together with the cooling fans 80 and 81 in combination. The cooling fans 80 and the additional fans 82 cool the heat generating members on the logical substrates 7 mounted on the front side of the chassis 2 and the cooling fan 81 and the additional fan 83 cool the heat generating members on the logical substrates 7 mounted on the back side of the chassis 2. The fan device 8 is connected so as to allow insertion and removal from the front side or the back side of the chassis 2 with respect to the backboard 6 in the same manner as the logical substrates 7.

The fan device 8 includes the cooling fans 80 and 81, the additional fans 82 and 83, a supporting member 84 which supports these fans, and a connector 85 to be connected to the backboard 6. The bottom surface of the supporting member 84 is formed with a rectangular hole 840 for allowing flow of cooling air from the fans. The additional fans 82 and 83 are provided on the backboard 6 side in a state of being adjusted in angle in advance so as to cause the cooling air to blow on the heat areas which need to get the cooling air. The angle of the additional fans 82 and 83 is adjusted on the package to package basis. The additional fans 82 and 83 of the fan device 8 are adjusted to assume an angle of $0° \leqq \theta 1 \leqq 90°$ ... (1) with respect to the depth direction X of the chassis 2. In this embodiment, the angle $\theta 1$ of the additional fan 82 of a fan unit 8A to be inserted on the front side of the chassis 2 is adjusted within a range from 0° to 90°, and the angle $\theta 1$ of the additional fan 83 of a fan unit 8B to be inserted on the back side of the chassis 2 is adjusted to be substantially parallel to the depth direction X of the chassis 2.

Therefore, as shown in FIG. 19, for example, when the FE package 72 mounted on the front side of the chassis 2 is replaced by another package and the another package is inserted into the backboard 6, it is necessary to change the fan unit which corresponds to the FE package 72 to another fan unit which corresponds to the another package.

Figure 20:
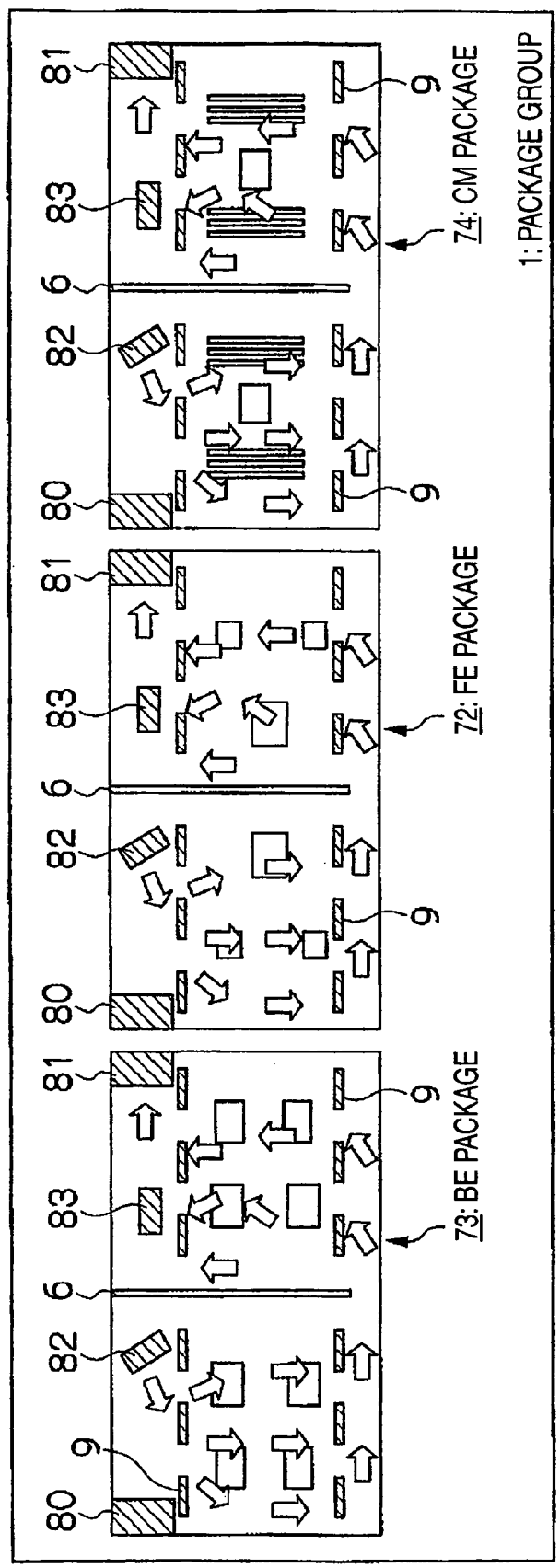
FIG. 20 is an explanatory drawing showing a flow channel of the cooling air in the package group 1.
Figure 21:
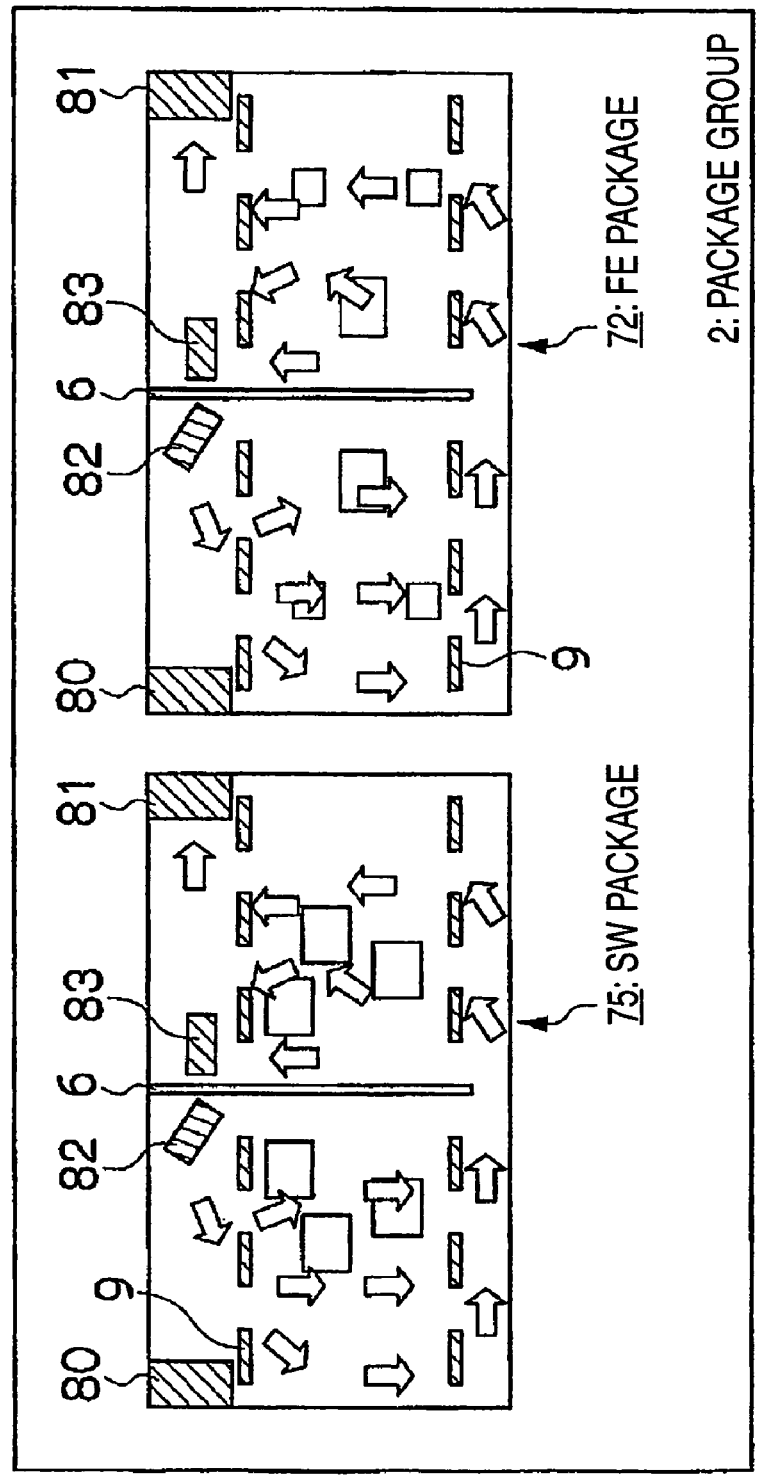
FIG. 21 is an explanatory drawing showing a flow channel of the cooling air in the package group 2.
Figure 22:
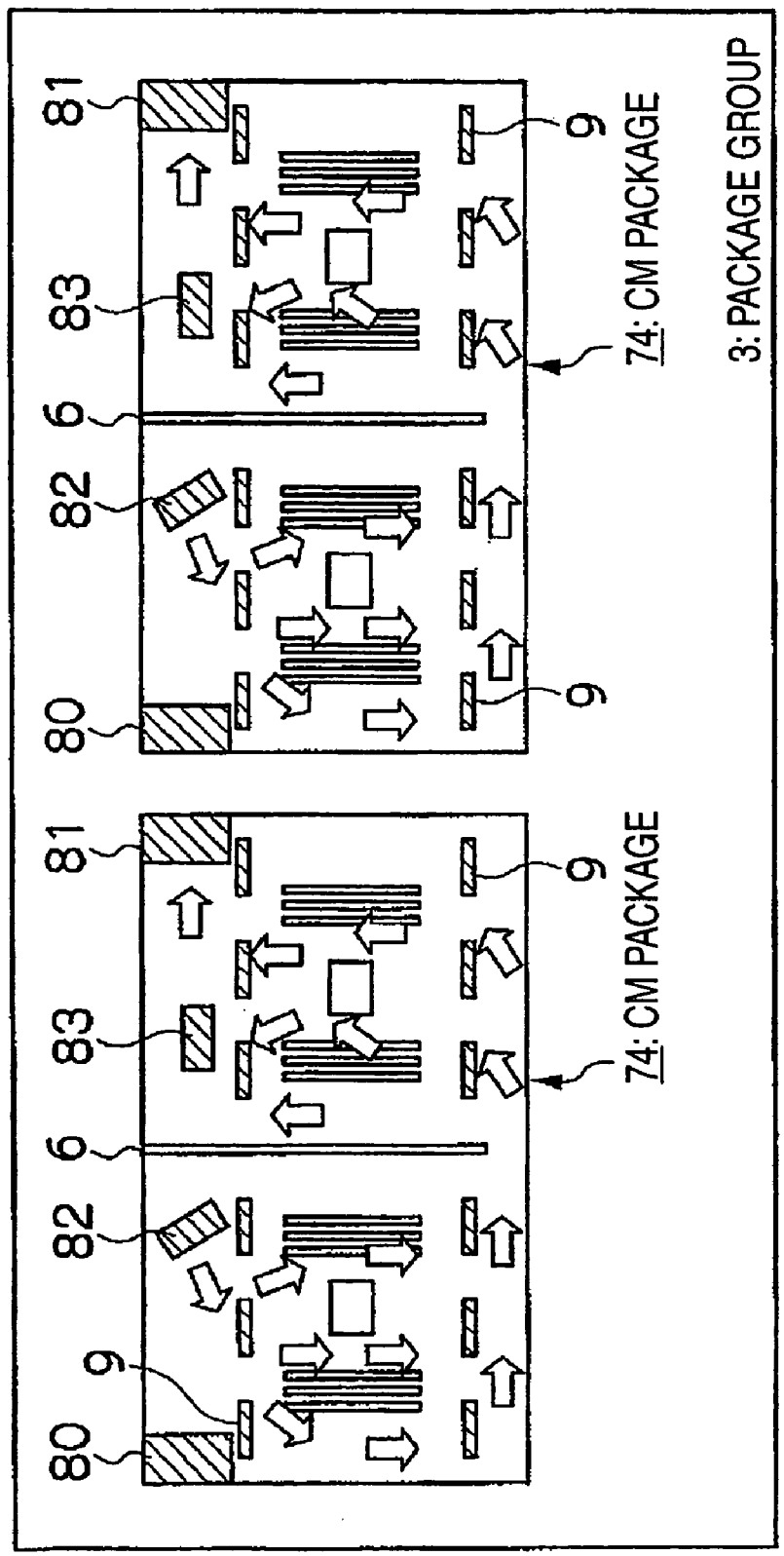
FIG. 22 is an explanatory drawing showing a flow channel of the cooling air in the package group 3.

How the cooling air flow to the logical substrate 7 when the fan units 8 with the additional fans 82 and 83 are mounted so as to correspond to the respective package groups is shown in FIG. 20 to FIG. 22.

When the fan device 8 for the package group 1 and the fan device 8 for the package group 3 are mounted, the cooling air flows over the entire areas on the packages. When the fan device 8 for the package group 2 is mounted, the additional fans 82 and 83 are arranged in the vicinity of the backboard 6 on the side of the grounded surface of the chassis 2 (with the face down) so that the additional fans 82 and 83 cool the logical substrates 7. In this manner, with the provision of the fan unit for the package group 2, the cooling air flows to the area in the vicinity of the backboard 6.

(1-5) Advantages of the First Embodiment

According to the first embodiment, the fans taking the arrangement of the heat generating members into consideration are added and are adapted to be inserted and removed as the fan unit, so that the cooling air in the chassis is stirred or flowed evenly without affecting the layout in the chassis.

Since the additional fans added to the backboard side are adapted to be pulled out from the backboard at once, maintenance replacement is easily carried out.

(2) Second Embodiment

A second embodiment will be described. In FIG. 1, reference numeral 10 generally designates a storage apparatus 1 according to the second embodiment. The storage system is configured in the same manner as the storage apparatus 1 in the first embodiment except for the configuration of the fans formed in the controller unit section 4. The same components as in the first embodiment are designated by the same reference numeral.

(2-1) Configuration of Fan Unit

The configuration of the fans in the controller unit section 4 in the second embodiment is different from the first embodiment in the configuration of the fan unit to be installed above the logical substrates 7.

Figure 23:
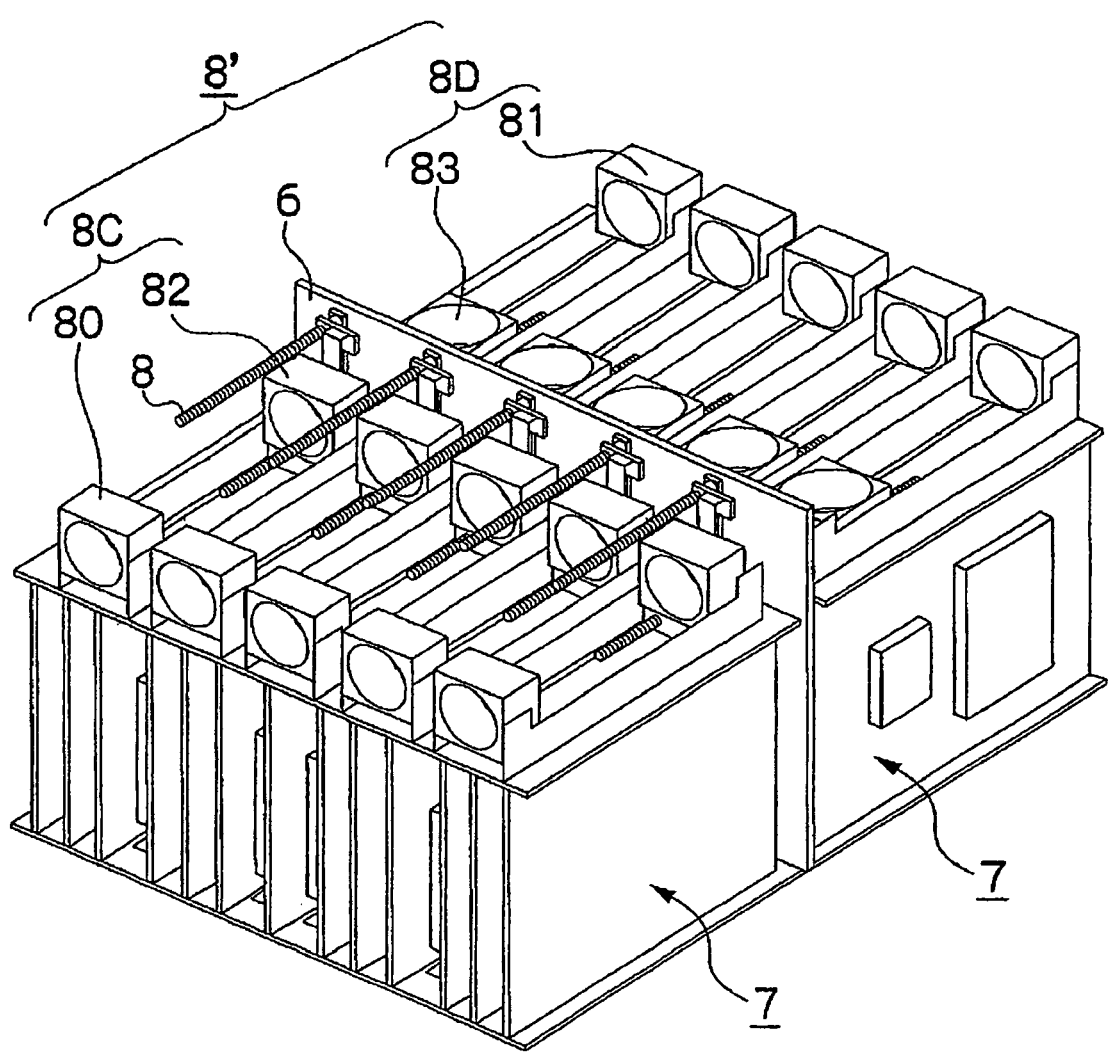
FIG. 23 is a perspective view showing a configuration of the controller unit section according to the second embodiment.

More specifically, as shown in FIG. 23, when a fan device 8' in the second embodiment is inserted toward the backboard 6 from the front side and the back side of the chassis 2, the additional fans 82 and 83 are adjusted to assume optimal location and angle. The fan device 8' is configured in a different manner for a fan unit 8C to be provided on the front side of the chassis 2 and for a fan unit 8D to be provided on the back side of the chassis 2.

Figure 24:
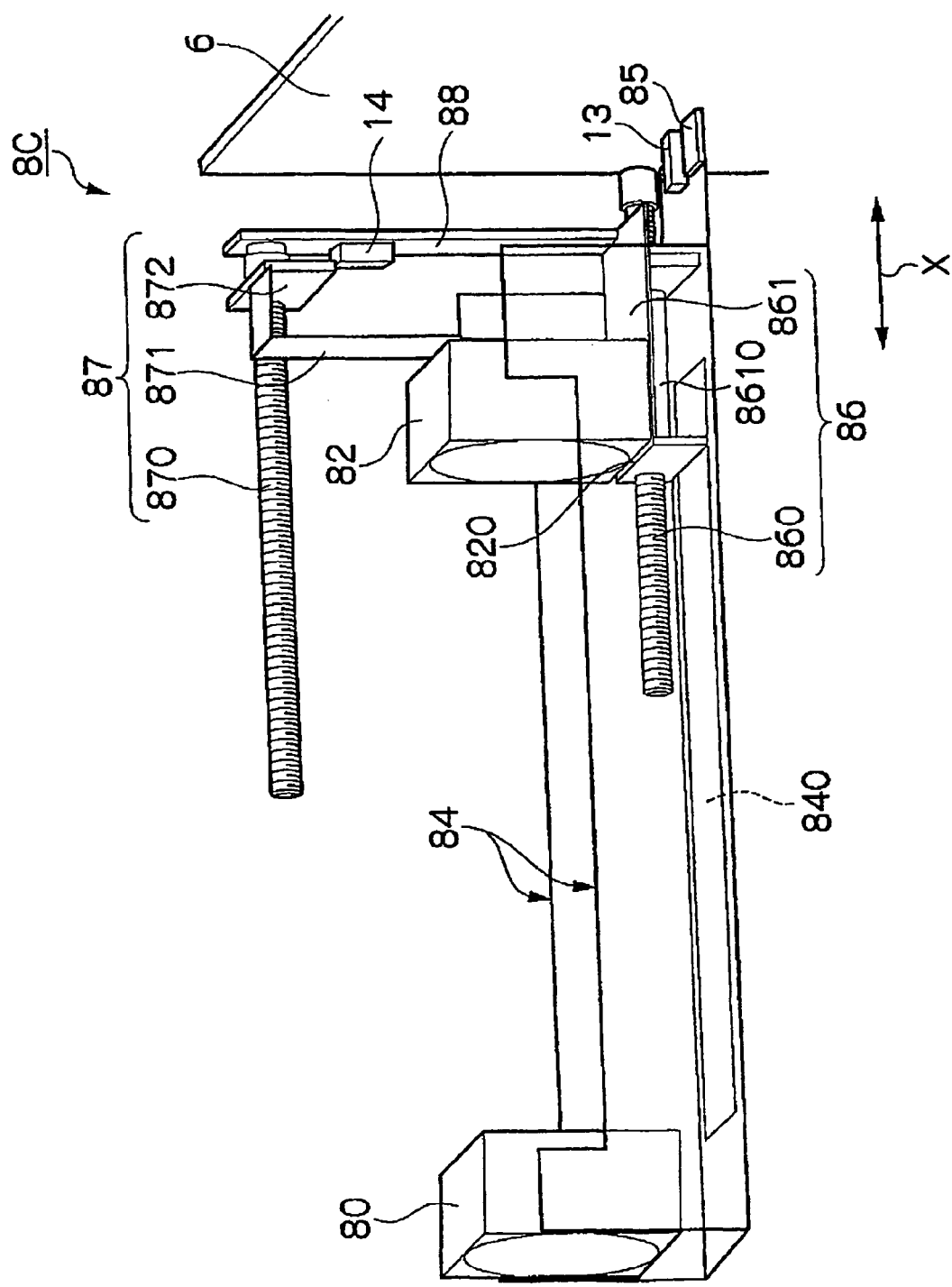
FIG. 24 is a configuration drawing showing the fan unit according to the second embodiment.

The fan unit 8C to be provided on the front side of the chassis 2 will be shown in FIG. 24. The fan unit 8C includes a location member 86 for determining an arbitrary location of the additional fan 82, an angle member 87 for adjusting an arbitrary angle of the additional fan 82, a connecting member 88 for connecting the location member 86 and the angle member 87, and motors 13, 14 for automatically adjusting the location member 86 and the angle member 87 in addition to the cooling fan 80, the additional fan 82, the supporting member 84 for supporting these fans, and the connector 85 for the connection to the backboard 6.

The location member 86 includes a seat 861 for placing the additional fan 82 thereon and a ball screw 860 for fixing the location. The ball screw 860 is inserted into an insertion portion 8610 provided in the seat 861. The seat 861 fixes one side 820 of the additional fan 82. By rotating the screw shaft of the ball screw 860 using the motor 13, a ball (steel ball) located between the screw shaft and the seat 861 rotates, and the seat 861 is moved in the axial direction X (the direction of insertion and removal with respect to the backboard 6, or the depth direction of the chassis 2). When the processor of the MP package 71 controls the number of revolutions of the motor 14, the additional fan 82 is moved to an arbitrary location.

Figure 25:
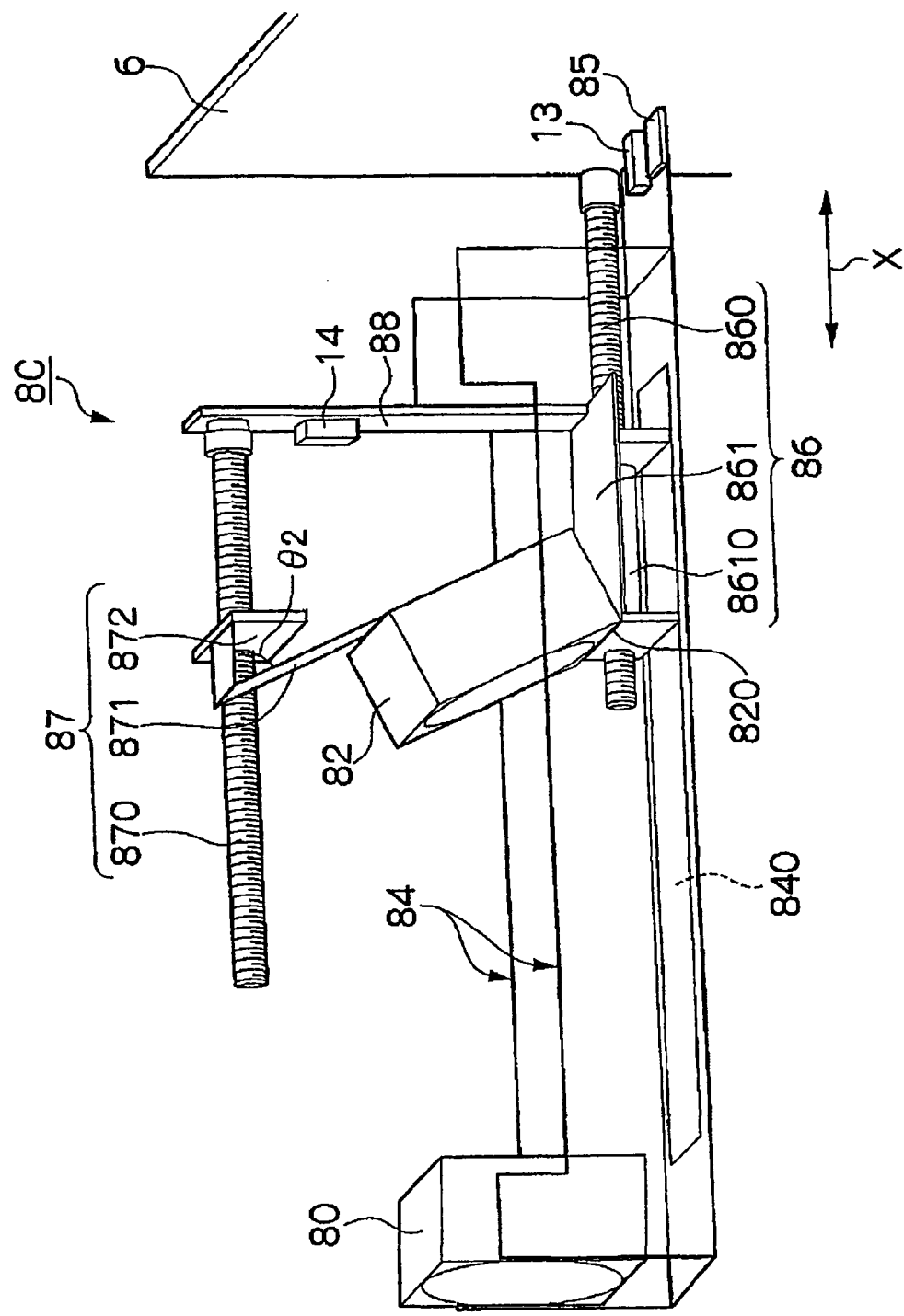
FIG. 25 is a configuration drawing showing a state after adjustment of the location and the angle of additional fans to be mounted on the front side of a chassis.

The angle member 87 includes a hinge unit 871 and a ball screw 870 for determining the angle of the additional fan 82, and a supporting unit 872 for supporting the hinge unit. By rotating the screw shaft of the ball screw 870 by using the motor 13, the supporting unit 872 moves in the axial direction X. Therefore, as shown in FIG. 25, the hinge unit 871 is bent at an acute angle θ2, and the additional fan 82 is inclined in the axial direction X. The additional fan 82 can be moved to the arbitrary angle by the processor of the MP package 71 controlling the number of revolutions of the motor.

Figure 26:
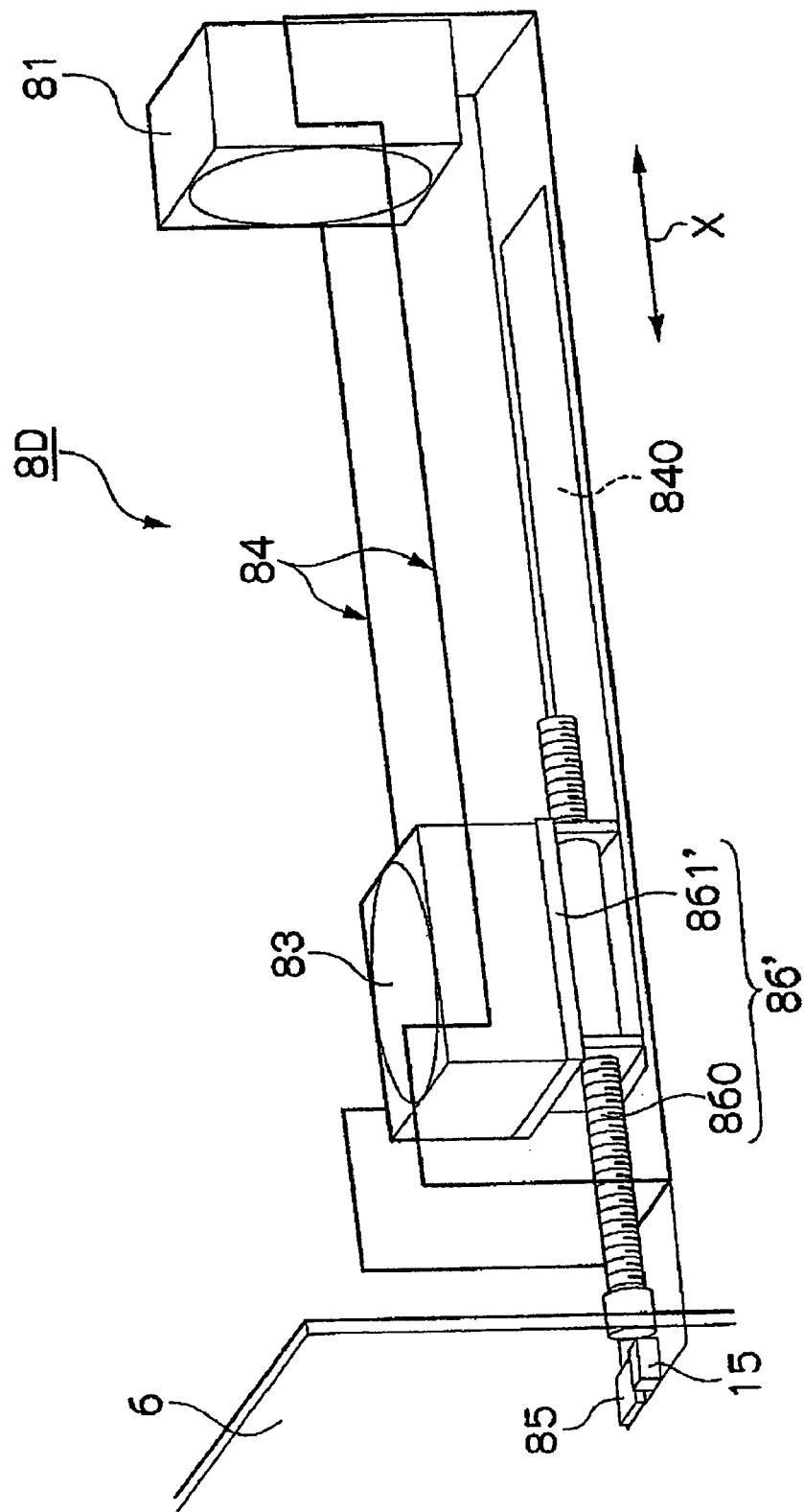
FIG. 26 is a configuration drawing showing the additional fans to be mounted on the back side of the chassis.

FIG. 26 shows a fan unit 8D to be provided on the back side of the chassis 2. The fan unit 8D includes a location member 86' for determining an arbitrary location of the additional fan 83 in addition to the cooling fan 81, the additional fan 83, the supporting member 84 for supporting these fans, and the connector 85 for the connection to the backboard 6.

Figure 27:
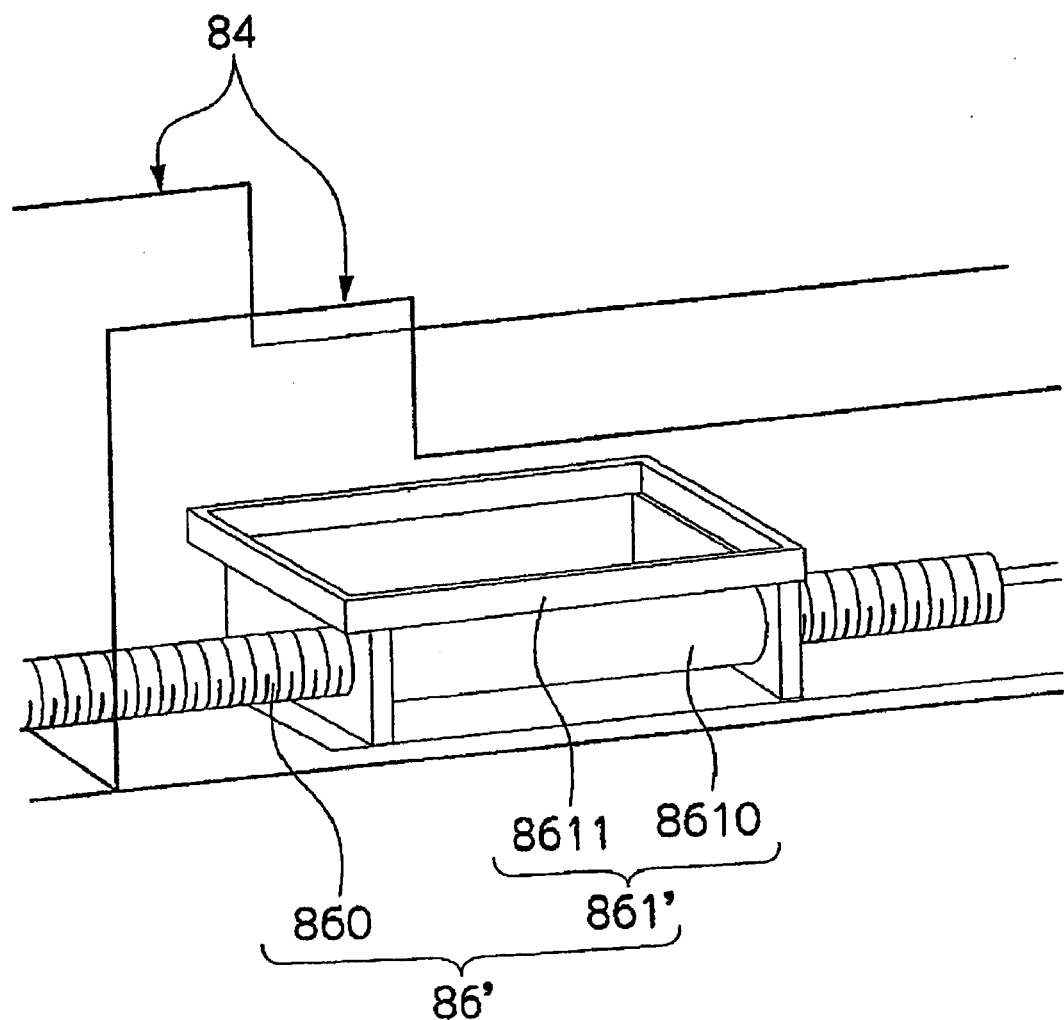
FIG. 27 is an enlarged configuration drawing showing a seat to be mounted on the back side of the chassis.

FIG. 27 shows a location member 86'. The location member 86' includes a seat 861' for placing the additional fan 83 and the ball screw 860 for determining the location. The seat 861' includes a frame portion 8611 in a square shape for allowing the cooling air to flow toward the logical substrates 7. The additional fan is mounted on the seat 861' in the square shape, and hence the additional fan is installed in parallel to the depth direction X of the chassis 2. By rotating the screw shaft of the ball screw 860 by using a motor 15, the seat 861' is moved in the axial direction X (the direction of insertion and removal with respect to the backboard 6, or the depth direction of the chassis 2).

(2-2) Control of Fan Unit

Subsequently, a case of changing the location and the angle of the additional fans 82 and 83 which constitute the fan device 8' will be described.

Figure 28:
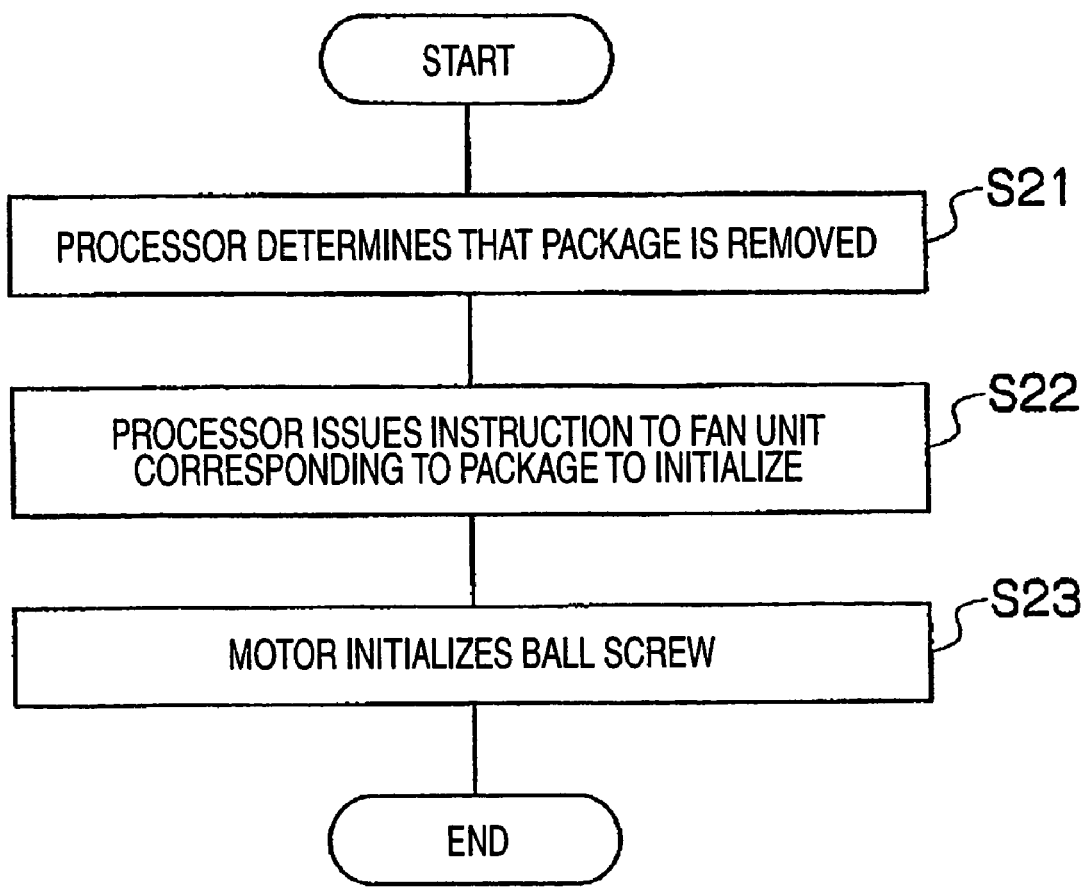
FIG. 28 is a flowchart of a procedure to be taken when an arbitrary package mounted on the front side of the chassis is removed from a backboard.

Referring now to a flowchart in FIG. 28, a case in which an arbitrary package mounted on the front side of the chassis 2 is pulled out from the backboard 6 will be described. The processor of the MP package 71 determines that the arbitrary package has pulled out from the backboard 6 because it cannot access the LSI (heat generating member) mounted on the corresponding arbitrary package (S21). Then, the processor of the MP package 71 issues an instruction to the fan unit 8C which corresponds to the arbitrary package (S22). More specifically, the processor of the MP package 71 sends an instruction to the motor 13 for adjusting the location of the location member 86, and the motor 14 for adjusting the angle of the angle member 87 to return the ball screws 860 and 870 to the initial state. The motors 13 and 14 which received this instruction returns the ball screws 860 and 870 to the initial state (S23). The initial state of the additional fan 82 mounted on the front side of the chassis 2 is a sate in which the additional fan 82 is located in the vicinity of the backboard 6, and is vertical to the depth direction X of the chassis 2.

When the arbitrary package mounted on the back side of the chassis 2 is pulled out from the backboard 6, the processor of the MP package 71 issues an instruction to the motor 15 for adjusting the location of the location member 86' to return the ball screw 860 to the initial state. The initial state of the additional fan 83 mounted on the back side of the chassis 2 is such that the additional fan 83 is located in the vicinity of the backboard 6 and is parallel to the depth direction X of the chassis 2.

Figure 29:
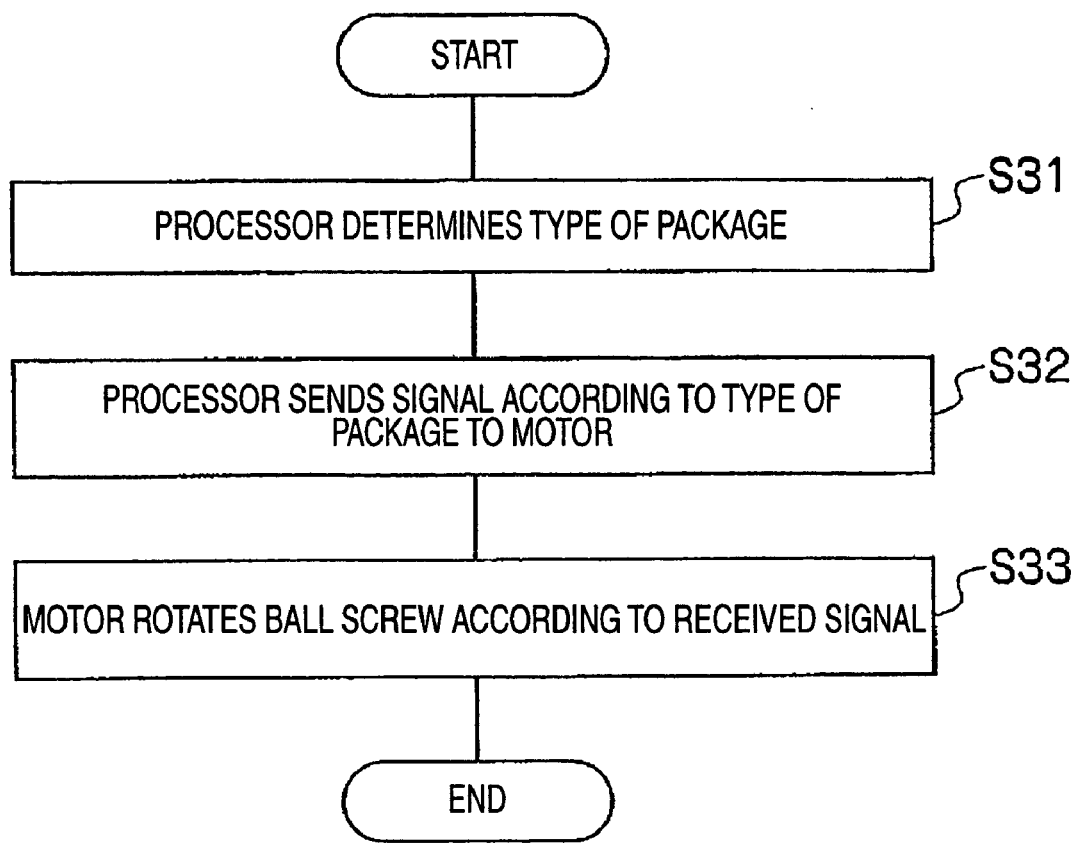
FIG. 29 is a flowchart of a procedure to be taken when inserting an arbitrary package to be mounted on the front side of the chassis into the backboard.

Referring now to a flowchart in FIG. 29, a case in which the arbitrary package is inserted into the backboard 6 from the front side of the chassis 2 will be described. The processor in the MP package 71 reads package information from the LSI (heat generating member) mounted on the arbitrary package, and determines the type of the package (S31). The processor of the MP package 71 sends a signal corresponding to the type of the package to the motor 13 for adjusting the position of the location member 86 and the motor 14 for adjusting the angle of the angle member 87 (S32). The signal corresponding to the type of the package is stored in a local memory of the MP package 71. For example, when the package is the FE package 72, the processor sends a signal to rotate the ball screw 860 for adjusting the location by 5 turns and to rotate the ball screw 870 for adjusting the angle by 20 turns. When the package is the BE package 73, the processor sends a signal to rotate the ball screw 860 for adjusting the location by 10 turns and to rotate the ball screw 870 for adjusting the angle by 10 turns. In this manner, the processor gives instructions to the motors 13, 14, and 15 which are capable of rotating the ball screws 860 and 870 by the predetermined numbers of turns according to the type of the package. The respective motors 13, 14, and 15 rotate the ball screws 860 and 870 by the specified numbers of turns upon reception of the instruction (S33).

(2-3) Advantages of the Second Embodiment

According to the second embodiment, the fans in which the arrangement of the heat generating members is taken into consideration is added so as to be capable of being inserted and removed as a fan device, and hence the cooling air in the chassis is stirred or flowed evenly without being affected by the layout in the chassis.

The storage apparatus, which recognizes the logical substrates to be inserted or removed, is by itself able to adjust the location and the angle of the fans added with the arrangement of the heat generating members on the logical substrate taken into consideration.

In addition, since a structure in which the additional fans added on the backboard side paired with the cooling fans can be pulled out from the backboard together at once, maintenance replacement is easily carried out.

(3) Third Embodiment

A third embodiment will now be described. In FIG. 1, reference numeral 100 generally designates the storage apparatus 1 according to a third embodiment. The storage system is configured in the same manner as the storage apparatus 1 in the first embodiment other than the configuration of a MP package 71' formed in the controller unit section 4. In the third embodiment, the electric power of the logical substrate 7 and the number of revolutions of the fans corresponding to the corresponding logical substrate 7 are controlled according to the electric load applied to the corresponding logical substrate 7. In the third embodiment, the term "fans" means the cooling fans 80 and 81 and the additional fans 82 and 83 which constitute the fan devices 8 and 8' described in the first embodiment and the second embodiment.

(3-1) Configuration of MP Package

Figure 30:
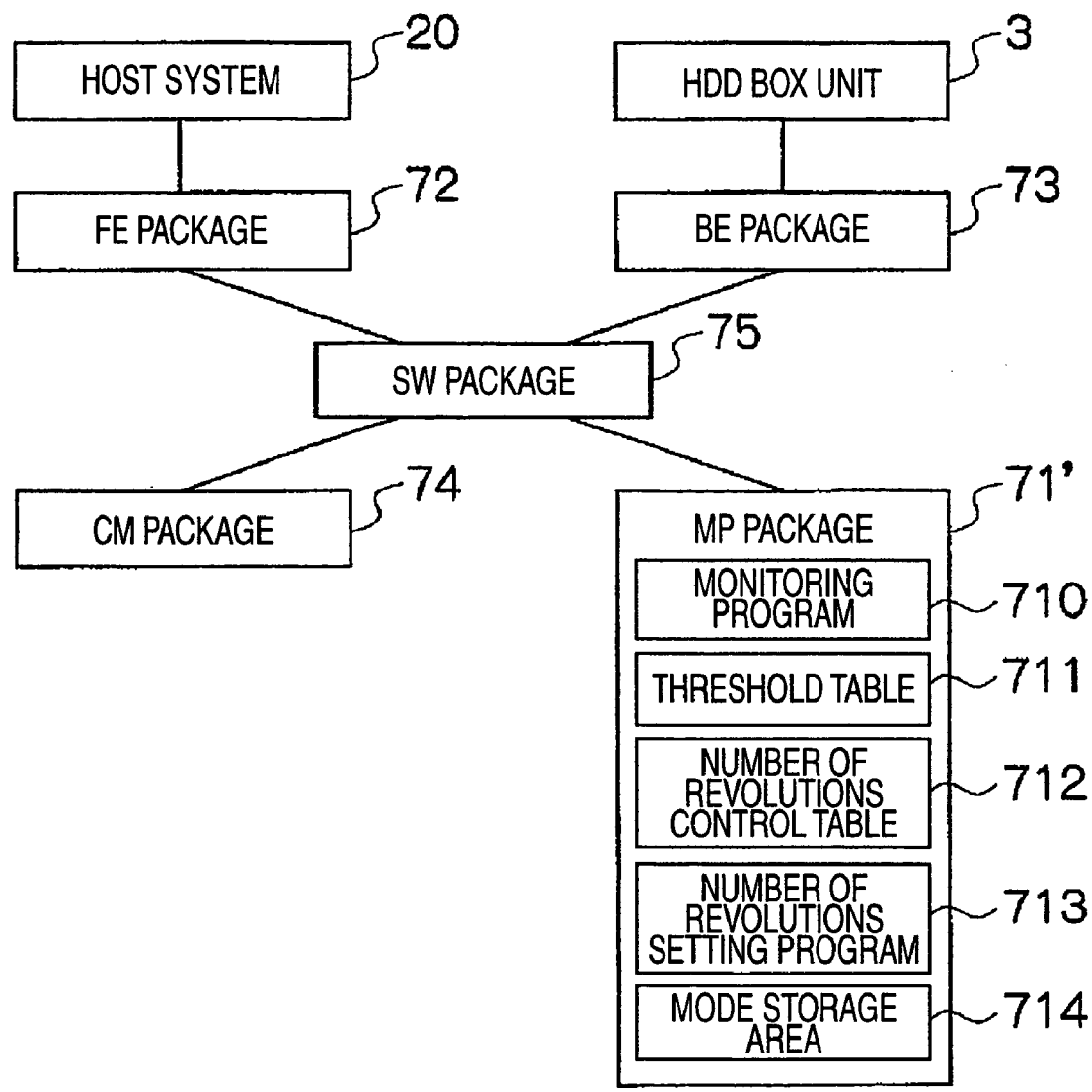
FIG. 30 is a data connection chart including a MP package in the third embodiment.

FIG. 30 shows the MP package 71' according to the third embodiment. The MP package 71' includes a LSI which controls the power consumption of the logical substrate 7 (package) integrated therein. The LSI retains a monitoring program 710 for monitoring the transfer size of data flowing in the package, a threshold table 711, a number of revolutions control table 712 for controlling the number of revolutions of the fans, a number of revolutions setting program 713 for setting the number of revolutions of the fans, and a mode storage area 714 for storing an operation mode of the package described later.

(3-1-1) Threshold Table

The threshold table 711 is a table to be retained by each package, and is a table including thresholds of the transfer size of the data that the package transfers, and the control mode for controlling the electric power of the package according to the transfer size. The control mode includes a mode in which the package normally operates and a power-saving mode in which the package operates with a power smaller than the normally required power.

FIG. 31 shows a threshold table 711A retained by the FE package 72, FIG. 32 shows a threshold table 711B retained by the BE package 73, and FIG. 33 shows a threshold table 711C retained by the SW package 75 and the CM package 74.

The threshold table 711 includes a "data transfer size" column 7110 showing the transfer size of the data that the package transfer, and a "mode" column 7111 showing the control mode of the package. The "data transfer size" column 7110 is defined differently from package to package.

In the "data transfer size" columns 7110 in the threshold tables 711A and 711B retained by the FE package 72 or the BE package 73, ratios of the average data transfer size of the plurality of FE packages 72 and the plurality of BE packages 73 are recorded. Assuming that the limit value of the performance of the package is 100%, the percentage of the data that the corresponding package transfers is recorded. In the third embodiment as well, the number of packages are the same as that descried in the first embodiment, there are eight FE packages 72, and eight BE packages 73. Therefore, the data transfer sizes marked in the threshold tables 711A and 711B retained by the FE package 72 or the BE package 73 are ratios of the average data transfer size transferred by the eight packages.

In the "data transfer size" column in the threshold table retained by the SW package 75 or the CM package 74, the ratio of the data transfer size transferred by a single package is recorded.

For example, the threshold table 711A retained by the FE package 72 shown in FIG. 31 indicates that one of the eight FE packages 72 is switched to the power-saving mode when the average transfer size of the data transfer sizes transferred by the eight FE packages 72 is from 75.1% to 87.5%. For example, the "⅛ power-saving mode" in the "mode" column 7111 is taken when it is determined that if the average data transfer size of the eight packages is 85%, all the data is sufficiently transferred by operating the seven FE packages at the data transfer size of 97% to 98% even when the processor of the MP package 71' switches one of the eight FE packages into the power-saving mode. In this case, it is necessary to allocate the data transfer job retained by the corresponding one of the FE packages to other seven FE packages before switching the one FE package into the power-saving mode.

In the threshold table 711B retained by the BE package 73 as well, the average transfer sizes are set in the "data transfer size" column 7110 as the threshold table 711A retained by the FE package 72.

The threshold table 711C retained by the SW package 75 shown in FIG. 33 indicates that the mode is switched to the power-saving mode when the data transfer size transferred by one SW package 75 is 0%. In this example, the power-saving mode of the SW package 75 and the CM package 74 means to turn OFF the power of the packages.

(3-1-2) Number of Revolution Control Table

The number of revolutions control table 712 is a table retained by each package group, and is a table for controlling the number of revolutions of the fans for cooling the package. The number of revolutions control table 712 is a table in which how the number of revolutions of the fan corresponding to the package group is to be controlled when the package in the group is switched to the power-saving mode.

The number of revolutions control table 712 includes a "package operating mode" column 7120 for the package which constitutes the package group and a "number of revolutions level" column 7121 for the fan which cools the package group. The operating modes in the third embodiment include a normal operating mode and a power-saving mode. The levels in number of revolutions are set from level 1 for low number of revolutions upward to level 4 for the normal revolutions.

Figure 35:
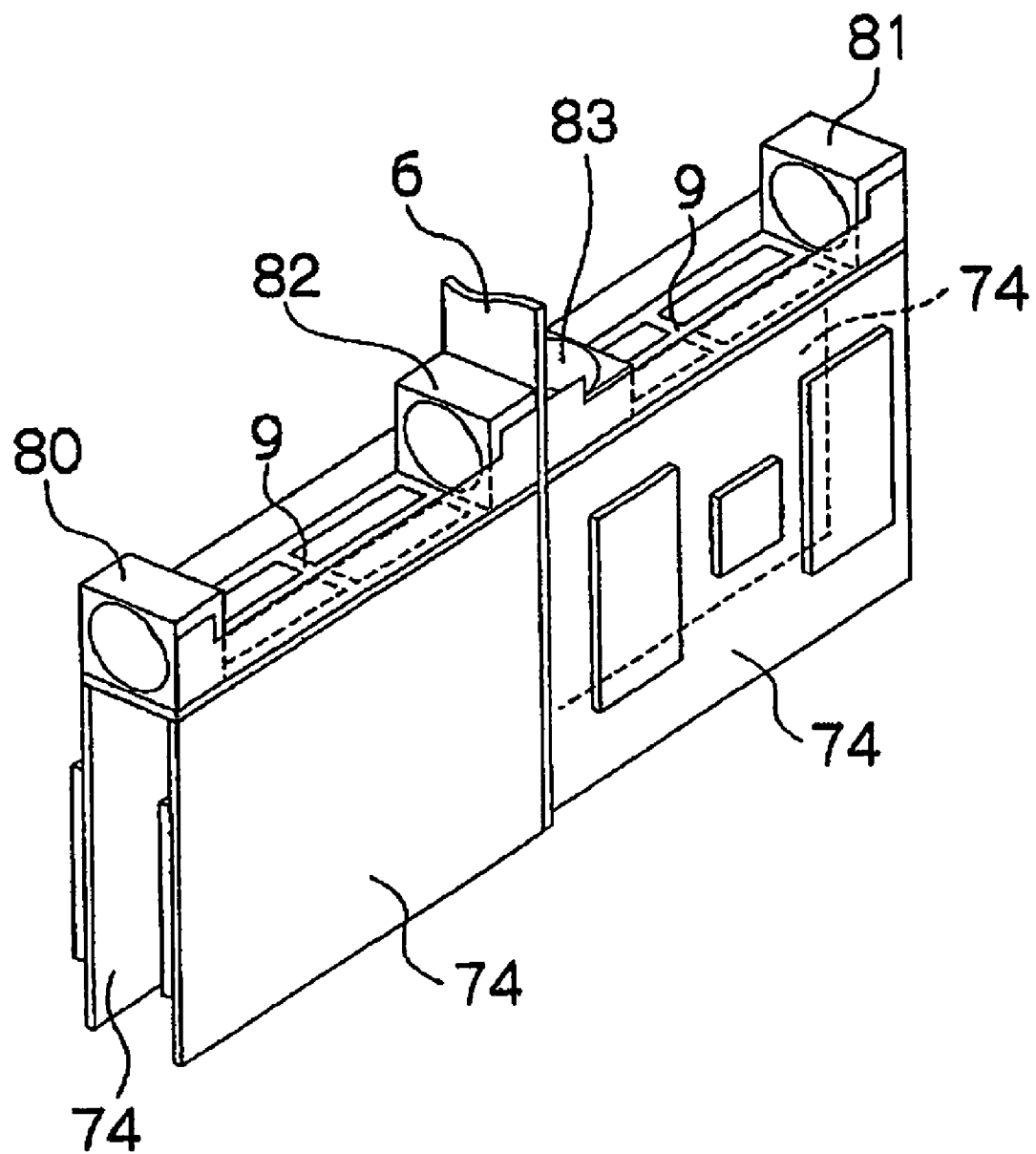
FIG. 35 is a perspective view showing a configuration of the package group 3.

For example, FIG. 34 shows a number of revolution control table retained by the package group 3. The package group 3 includes the four CM packages 74 mounted on the front side and the back side of the chassis 2 as shown in FIG. 35. Since the fans for cooling the package group 3 are the fan units 8, 8' described in the first embodiment and the second embodiment, the four fans are mounted on the front side and the back side of the chassis 2.

In the "package operating mode" column 7120 in FIG. 34, the operating modes for each package which constitutes the package group are set as shown in FIG. 35. The two CM packages mounted on the front side of the chassis 2 correspond to the package 1 and package 2, respectively, and the two CM packages mounted on the back side of the chassis 2 correspond to the package 3 and the package 4, respectively.

In the "number of revolutions level" column 7121 in FIG. 34, the numbers of revolutions are set for each set of the fans 80 to 83, which cools the package group, as shown in FIG. 35. In FIG. 35, the fan device 8 described in the first embodiment is mounted. The cooling fan 80 corresponds to the fan A, the additional fan 82 corresponds to the fan B, the additional fan 83 corresponds to the fan C, and the cooling fan 81 corresponds to the fan D.

In the pattern 1, while the respective packages which constitute the package group 3 are operated at a normally required electric power, the fans also cool the packages at a normal number of revolutions.

In the pattern 2, when at least one of the packages mounted on the front side of the chassis 2 is switched to the power-saving mode, the fans cool at a number of revolutions of the level 3. When at least one of the packages mounted on the front side of the chassis 2 is switched to the power-saving mode, the total heating value of the package to be mounted on the front side of the chassis 2 decreases, so that the temperature of the air flowing toward the back side of the chassis 2 is lower than that in the case in which all the packages to be mounted on the front side of the chassis 2 are operated in the normal mode.

In the pattern 3, when at least one of the packages to be mounted on the back side of the chassis 2 is switched to the power-saving mode, the fans cool the corresponding package at a number of revolutions of level 4. Since all the packages to be mounted on the front side of the chassis 2 are operated at the normal mode, the total heating value of the packages to be mounted on the front side of the chassis 2 is the same as the pattern 1. Therefore, the fans are rotated at the number of revolutions of the level 4.

In the pattern 4, two of the packages to be mounted on the front side or the back side of the chassis 2 are switched to the power-saving mode, one of the two fans corresponding to the two packages which has switched to the power-saving mode is stopped, and the other one is used for cooling the corresponding package at the number of revolutions of the level 2. In the pattern 4, either one of the front side or the back side of the chassis 2 is switched to the power-saving mode. It is not necessary to cause the cooling air to flow evenly, the additional fan on the side which is switched to the power-saving mode may be stopped.

In the pattern 5, when one each of the two packages to be mounted on the front side and on the back side of the chassis 2 respectively is switched to the power-saving mode, all the fans cool the corresponding packages at the number of revolutions at the level 2.

In the pattern 6, when all the packages which constitute the package groups are switched to the power-saving mode, only the cooling fans are rotated at the number of revolutions of the level 1 considering the influence on other package groups.

FIG. 34 shows the number of revolutions control table 712 retained by the package group 3, and the number of revolutions control tables retained by the package groups 1 and 2 are also set so that the number of revolutions of the fans may be controlled according to the operating mode of the package.

(3-2) Switching to the Power-Saving Mode and Control of Number of Revolutions

Referring now to a flowchart in FIG. 36, a process of switching the package to the power-saving mode by the processor of the MP package 71' using the threshold table 711 and the number of revolutions control table 712 to control the number of revolutions of the corresponding fan will be described. This process is executed by the processor of the MP package 71' on the basis of the monitoring program 710 and the number of revolutions setting program 713.

When the type of the package is specified, the processor of the MP package 71' acquires the data transfer size to be transferred by all the specific number packages (S41). Since the processor directly monitors the data transfer size, the processor is able to acquire the data transfer size to be transferred by the package. When the package is the FE package 72 or the BE package 73, the processor calculates an average transfer size of the acquired data transfer sizes. When the package is the SW package 75 or the CM package 74, the processor acquires the data transfer size for one package.

Then, the processor of the MP package 71' compares the data transfer size acquired according to the type of the package and the data transfer size preset in the threshold table (S42), and switches to the power-saving mode for the corresponding package according to the mode in the threshold table in which the both data transfer sizes match (S43).

For example, when the type of the package is the FE package, and one of the eight packages is switched to the power-saving mode, the processor of the MP package 71' carries out the following procedure as the switching process. First of all, the processor of the MP package 71' specifies a package whose current data transfer size is the smallest, and allocates the data transfer job of the specified package to other packages. Then, the processor of the MP package 71' switches the specified packages to the power-saving mode. When two or more of eight packages are to be switched to the power-saving mode, the processor of the MP package 71' specifies a package on the basis of the current data transfer size in the ascending order.

The processor of the MP package 71' writs the mode information of the package which is switched to the power-saving mode in the mode storage area 714 (S44) and carries out the steps from S41 to S44 for all the packages (S45: NO). Then, when the switching to the power-saving mode is completed for all the package types, the processor of the MP package 71' compares the mode information written in the mode storage area 714 and the operating mode of the package in the number of revolution control table (S46). Then, the processor of the MP package 71' sets the number of revolutions of the fan (S47) according to the level of the number of revolutions of the fan corresponding to the operating mode of the package in the number of revolutions control table which matches the mode information, and then the process ended.

(3-3) Advantages of the Third Embodiment

According to the third embodiment, since the fans in which the arrangement of the heat generating members is taken into consideration are added and may be inserted and removed as the fan unit, so that the cooling air in the chassis is stirred or is caused to flow evenly without affecting the layout in the chassis.

The switching to the power-saving mode (power OFF) may be achieved from package to package, and hence the number of revolutions of the fan for cooling the corresponding package may be controlled according to the mode of the package.

What is claimed is:

1. A storage apparatus comprising:
   a disk box unit that stores a plurality of hard disk drives;
   a controller unit section that inputs and outputs data to and from the hard disk drives in response to data input and output requests from a host system, the controller unit comprising one or more logical substrates;
   a power supply unit that supplies power to the disk box unit and the controller unit section;
   a chassis that stores the disk box unit, the controller unit section, and the power supply unit therein;
   a backboard mounted on a bottom surface of the chassis to extend vertically within the chassis at a center region of the chassis, the backboard having a first side facing a front side of the chassis and a second side facing a back side of the chassis, the backboard connecting to each of the disk box unit, the controller unit section, and the power supply unit via both the first and second sides so as to allow insertion and removal of the disk box unit, the controller unit section, and the power supply unit from each of the front side and the back side of the chassis; and
   a fan device that introduces air from outside of the chassis to a heat area generated from one or more heat generating members arranged on the one or more logical substrates, cools the heat area by stirring the air introduced to the heat area therein or by causing the air introduced to the heat area to blow evenly thereon, and discharges the air introduced to the heat area from the chassis upon the air introduced to the heat area passing through the heat area, the fan device including a first portion and a second portion that are respectively mounted from the front and rear sides of the chassis with the backboard therebetween.

2. The storage apparatus according to claim 1, wherein the first portion of the fan device includes:
a first set of cooling fans mounted from the front side of the chassis so as to introduce the air from outside of the chassis to the heat area; and
a first set of additional fans mounted from the front side of the chassis and proximate to the first side the backboard
wherein the second portion of the fan device includes:
a second set of cooling fans mounted from the back side of the chassis so as to discharge the air passed through the heat area for cooling the same to the outside; and
a second set of additional fans mounted from the back side of the chassis and proximate to the second side the backboard, the first and second sets of additional fans allowing the air introduced to the heat area to be stirred in the heat area or to blow evenly thereon, and
wherein the first and second sets of cooling fans and the first and second sets of additional fans are mounted on the controller unit section so as to allow insertion and removal of the first set of cooling fans and the first set of additional fans to and from the front side of the of the chassis and the second set of cooling fans and the second set of additional fans to and from the back side of the of the chassis.

3. The storage apparatus according to claim 2, wherein each fan of the first and second sets of additional fans is mounted at a respective location and at a respective angle for allowing the air introduced to the heat area to be stirred in the heat area or to blow evenly thereon according to an arrangement of the one or more heat generating members on the one or more logical substrates.

4. The storage apparatus according to claim 2, wherein the first set of additional fans are mounted so as to allow adjustment of the respective angle for each fan of the first set of additional fans from 0 degrees to 90 degrees with respect to a direction of insertion and removal of the one or more logical substrates.

5. The storage apparatus according to claim 2, wherein the second set of additional fans are mounted so as to be parallel to a direction of insertion and removal of the one or more logical substrates.

6. The storage apparatus according to claim 3, wherein the each fan of first and second sets of additional fans is mounted with a respective seat for placing the fan thereon at a location so as to blow the air introduced to the heat area onto the heat area by rotating a ball screw inserted through the respective seat of the fan.

7. The storage apparatus according to claim 3, wherein the each fan of the first and second sets of additional fans is mounted with a respective hinge member for adjusting the respective angle of the fan so as to blow the air introduced to the heat area onto the heat area by rotating a ball screw inserted through the respective hinge member of the fan.

8. A fan device, comprising:
a first portion and a second portion that are mounted on a controller unit section stored within a chassis from a front side and a rear side of the chassis respectively and with a backboard therebetween, the backboard having a first side facing the front side of the chassis and a second side facing the back side of the chassis, the backboard being mounted on a bottom surface of the chassis to extend vertically within the chassis at a center region of the chassis, the backboard connecting to the controller unit section via both the first and second sides so as to allow insertion and removal of the controller unit section from each of the front side and the back side of the chassis, the controller unit section inputting and outputting data to and from a plurality of hard disk drives in response to data input and output requests from a host system, the controller unit section comprising one or more logical substrates;
wherein the fan device introduces air from outside of the chassis to a heat area generated from one or more heat generating members arranged on the one or more logical substrates, cools the heat area by stirring the air introduced to the heat area therein or by causing the air introduced to the heat area to blow evenly thereon, and discharges the air introduced to the heat area from the chassis upon the air passing through the heat area,
wherein the first portion of the fan device includes:
a first set of cooling fans mounted from the front side of the chassis so as to introduce the air from outside of the chassis to the heat area; and
a first set of additional fans mounted from the front side of the chassis and proximate to the first side the backboard,
wherein the second portion of the fan device includes:
a second set of cooling fans mounted from the back side of the chassis so as to discharge the air passed through the heat area for cooling the same to the outside; and
a second set of additional fans mounted from the back side of the chassis and proximate to the second side the backboard, the first and second sets of additional fans allowing the air introduced to the heat area to be stirred in the heat area or to blow evenly thereon, and
wherein the first and second sets of cooling fans and the first and second sets of additional fans are mounted on the controller unit section so as to allow insertion and removal of the first set of cooling fans and the first set of additional fans to and from the front side of the of the chassis and the second set of cooling fans and the second set of additional fans to and from the back side of the of the chassis.

9. The fan device according to claim 8, wherein each fan of the first and second sets of additional fans is mounted at a respective location and at a respective angle for allowing the air introduced to the heat area to be stirred in the heat area or to blow evenly thereon according to an arrangement of the one or more heat generating members on the one or more logical substrates.

10. The fan device according to claim 8, wherein the first set of additional fans are mounted so as to allow adjustment of the respective angle for each fan of the first set of additional fans from 0 degrees to 90 degrees with respect to a direction of insertion and removal of the one or more logical substrates.

11. The fan device according to claim 8, wherein the second set of additional fans are mounted so as to be parallel to a direction of insertion and removal of the one or more logical substrates.

12. The fan device according to claim 8, wherein the each fan of first and second sets of additional fans is mounted with a respective seat for placing the fan thereon at a location so as to blow the air introduced to the heat area onto the heat area by rotating a ball screw inserted through the respective seat of the fan.

13. The fan device according to claim 8, wherein the each fan of the first and second sets of additional fans is mounted with a respective hinge member for adjusting the respective angle of the fan so as to blow the air introduced to the heat area onto the heat area by rotating a ball screw inserted through the respective hinge member of the fan.

14. A controller unit device that inputs and outputs data to and from hard disk drives in response to data input and output requests from a host system, the controller unit device comprising:

a set of logical substrates connected to both a front side and a back side of a backboard mounted on a bottom surface of a chassis to extend vertically within the chassis at a center region of the chassis, the first and second sides of the backboard respectively facing a front side a second side of the chassis to thereby allow insertion and removal of the set of logical substrates from each of the front side and the back side of the chassis; and a fan unit that introduces air from outside of the chassis to a heat area generated by heat generating member arranged on the one or more logical substrates, cools the heat area by stirring the air introduced to the heat area therein or by causing the air introduced to the heat area to blow evenly thereon, and discharges the air introduced to the heat area from the chassis upon the air introduced to the heat area passing through the heat area, wherein the fan unit includes a first portion and a second portion that are respectively mounted from the front and rear sides of the chassis with the backboard therebetween, wherein the first portion of the fan device includes:

a first set of cooling fans mounted from the front side of the chassis so as to introduce the air from outside of the chassis to the heat area; and a first set of additional fans mounted from the front side of the chassis and proximate to the first side the backboard wherein the second portion of the fan device includes:

a second set of cooling fans mounted from the back side of the chassis so as to discharge the air passed through the heat area for cooling the same to the outside; and a second set of additional fans mounted from the back side of the chassis and proximate to the second side the backboard, the first and second sets of additional fans allowing the air introduced to the heat area to be stirred in the heat area or to blow evenly thereon, and wherein the first and second sets of cooling fans and the first and second sets of additional fans are mounted in the controller unit device so as to allow insertion and removal of the first set of cooling fans and the first set of additional fans to and from the front side of the of the chassis and the second set of cooling fans and the second set of additional fans to and from the back side of the of the chassis.

* * * * *